(12) United States Patent
Okina

(10) Patent No.: US 11,088,076 B2
(45) Date of Patent: Aug. 10, 2021

(54) BONDING PADS EMBEDDED IN A DIELECTRIC DIFFUSION BARRIER AND HAVING RECESSED METALLIC LINERS

(71) Applicant: SANDISK TECHNOLOGIES LLC, Addison, TX (US)

(72) Inventor: Teruo Okina, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/728,327

(22) Filed: Dec. 27, 2019

(65) Prior Publication Data
US 2021/0202382 A1    Jul. 1, 2021

(51) Int. Cl.
*H01L 23/528*    (2006.01)
*H01L 27/11524*    (2017.01)
(Continued)

(52) U.S. Cl.
CPC .... *H01L 23/5283* (2013.01); *H01L 21/76843* (2013.01); *H01L 21/76852* (2013.01); *H01L 21/76865* (2013.01); *H01L 23/5226* (2013.01); *H01L 23/53238* (2013.01); *H01L 23/53295* (2013.01); *H01L 24/06* (2013.01); *H01L 24/09* (2013.01); *H01L 27/1157* (2013.01);
(Continued)

(58) Field of Classification Search
CPC ............... H01L 24/02–09; H01L 24/80; H01L 2224/80895; H01L 2224/08147; H01L 2224/05026; H01L 2224/80357; H01L 2224/53228; H01L 2224/05147; H01L 23/5329–53295; H01L 21/76843; H01L 21/7685–76852; H01L 21/76865
See application file for complete search history.

(56) References Cited

U.S. PATENT DOCUMENTS 5,915,167 A    6/1999 Leedy
8,492,265 B2 *    7/2013 Yang ...................... H01L 24/92
                                                    438/618

(Continued)

FOREIGN PATENT DOCUMENTS

KR    10-2016-0007240 A    1/2016
KR    10-2017-0139342 A    12/2017

OTHER PUBLICATIONS

U.S. Appl. No. 16/231,752, filed Dec. 24, 2018, SanDisk Technologies LLC.

(Continued)

*Primary Examiner* — Younes Boulghassoul
(74) *Attorney, Agent, or Firm* — The Marbury Law Group PLLC

(57) ABSTRACT

A semiconductor die includes at least one first semiconductor device located on a first substrate, a first pad-level dielectric layer which is a diffusion barrier overlying the at least one first semiconductor device, and first bonding structures including a respective first metallic bonding pad embedded in the first pad-level dielectric layer. Each of the first bonding structures includes a metallic fill material portion having a horizontal distal surface that is located within a horizontal plane including a horizontal distal surface of the first pad-level dielectric layer, and a metallic liner laterally surrounding the metallic fill material portion and vertically spaced from the horizontal plane by a vertical recess distance.

14 Claims, 31 Drawing Sheets

(51) Int. Cl.
    *H01L 27/11556*     (2017.01)
    *H01L 23/532*     (2006.01)
    *H01L 27/11582*     (2017.01)
    *H01L 23/522*     (2006.01)
    *H01L 27/1157*     (2017.01)
    *H01L 23/00*     (2006.01)
    *H01L 21/768*     (2006.01)

(52) U.S. Cl.
    CPC .. *H01L 27/11524* (2013.01); *H01L 27/11556* (2013.01); *H01L 27/11582* (2013.01); *H01L 2224/05147* (2013.01); *H01L 2224/08147* (2013.01); *H01L 2224/80357* (2013.01); *H01L 2224/80895* (2013.01)

(56) References Cited

U.S. PATENT DOCUMENTS

| | | | |
|---|---|---|---|
| 9,027,821 B2* | 5/2015 | Di Cioccio | H01L 25/50 228/120 |
| 9,224,704 B2* | 12/2015 | Landru | H01L 24/03 |
| 9,728,521 B2* | 8/2017 | Tsai | H01L 21/3212 |
| 10,115,681 B1 | 10/2018 | Ariyoshi | |
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,510,738 B2 | 12/2019 | Kim et al. | |
| 10,685,875 B2* | 6/2020 | Hatano | H01L 21/76846 |
| 2004/0251550 A1* | 12/2004 | Yoda | H01L 21/76843 257/758 |
| 2005/0151224 A1* | 7/2005 | Abe | H01L 21/32135 257/510 |
| 2007/0205482 A1* | 9/2007 | Yang | H01L 23/53238 257/499 |
| 2012/0068355 A1* | 3/2012 | Aoki | H01L 25/50 257/774 |
| 2012/0171818 A1* | 7/2012 | Barth | H01L 23/5389 438/107 |
| 2014/0061914 A1* | 3/2014 | Dyer | H01L 23/53238 257/751 |
| 2014/0117546 A1* | 5/2014 | Liu | H01L 21/76834 257/751 |
| 2016/0013160 A1* | 1/2016 | Chun | H01L 24/80 257/751 |
| 2017/0069593 A1 | 3/2017 | Chou et al. | |
| 2017/0358553 A1* | 12/2017 | Kim | H01L 24/03 |
| 2019/0109042 A1* | 4/2019 | Katkar | H01L 24/09 |
| 2019/0221557 A1* | 7/2019 | Kim | H01L 25/50 |
| 2019/0252361 A1 | 8/2019 | Nishida | |

OTHER PUBLICATIONS

U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 13, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,220, filed Mar. 4, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
Notification of Transmittal of the International Search Report and Written Opinion of the International Search Authority for International Patent Application No. PCT/US2020/026182, dated Sep. 18, 2020, 9 pages.

* cited by examiner

BONDING PADS EMBEDDED IN A DIELECTRIC DIFFUSION BARRIER AND HAVING RECESSED METALLIC LINERS

FIELD

The present disclosure relates generally to the field of semiconductor devices, and particularly to structures containing bonding pads that include self-aligned diffusion barrier layers and methods for forming the same.

BACKGROUND

Wafer bonding or die bonding can be employed to provide a bonded assembly of multiple semiconductor dies. For example, two semiconductor dies providing different functionalities can be bonded to provide a semiconductor chip having combined functionalities. Metal wiring inside each semiconductor die provides metal interconnection among components within a respective semiconductor die.

SUMMARY

According to an embodiment of the present disclosure, a structure comprising a first semiconductor die is provided. The first semiconductor die includes at least one first semiconductor device located on a first substrate, a first pad-level dielectric layer which is a diffusion barrier overlying the at least one first semiconductor device, and first bonding structures including a respective first metallic bonding pad embedded in the first pad-level dielectric layer. Each of the first bonding structures includes a metallic fill material portion having a horizontal distal surface that is located within a horizontal plane including a horizontal distal surface of the first pad-level dielectric layer, and a metallic liner laterally surrounding the metallic fill material portion and vertically spaced from the horizontal plane by a vertical recess distance.

According to another embodiment of the present disclosure, a method of forming a structure including a first semiconductor die is provided. The method comprises: forming at least one first semiconductor device on a first substrate; forming a first pad-level dielectric layer over the at least one first semiconductor device; forming first cavities in the first pad-level dielectric layer; forming metallic liners in the first cavities, wherein each of the metallic liners is vertically recessed from a horizontal plane including a horizontal distal surface of the first pad-level dielectric layer toward the first substrate; and forming metallic fill material portions in remaining volumes of the first cavities on a respective one of the metallic liners, whereby first bonding structures comprising a respective first metallic bonding pad are formed, wherein each of the first bonding structures comprises a combination of a respective one of the metallic liners and a respective one of the metallic fill material portions.

DETAILED DESCRIPTION

Figure 1:
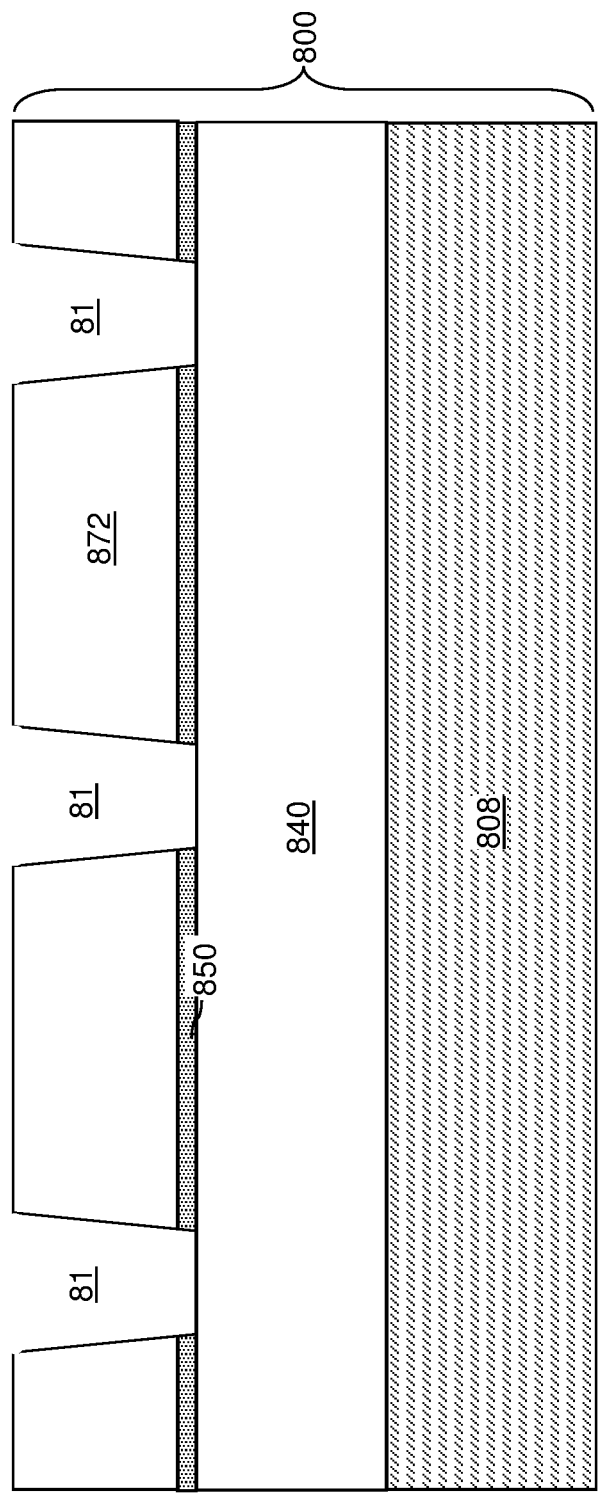
FIG. 1 is a vertical cross-sectional view of a first configuration of a first semiconductor die after formation of first via cavities according to a first embodiment of the present disclosure.

Bonding pads including copper are prone to recesses in regions proximal to metallic diffusion barrier layers, which can accelerate copper migration induced void formation. Bonding pads without recesses near metallic diffusion barrier layers are desirable. The embodiments of the present disclosure are directed to structures containing bonding pads that include self-aligned diffusion barrier layers and methods for forming the same, the various aspects of which are described herein in detail. The self-aligned diffusion barrier layers reduce or prevent the recess and void formation and improve the quality of the bonding between the dies.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the embodiments of the present disclosure may include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

A die may be in an isolated form (e.g., immediately after singulation from a structure including a plurality of dies), or may be connected to at least another die sharing a same substrate (such as a semiconductor wafer including a plurality of dies prior to singulation), or may be bonded to at least another die (for example, by metal-to-metal bonding among facing bonding pads or by an array of solder material portions located between two sets of bonding pads that face each other and embedded in different dies).

Referring to FIG. 1, a first configuration of a first semiconductor die 800 according to a first embodiment of the present disclosure is illustrated. The first semiconductor die 800 includes a first substrate 808 and a first device structure 840 formed over the first substrate 808. The first device structure 840 includes at least one first semiconductor device such as field effect transistors, a three-dimensional array of memory elements, or any other semiconductor device known in the art. The first device structure 840 may include at least one dielectric material layer at an upper portion thereof, and may include a plurality of electrically active nodes therein. The electrically active nodes of the first device structure 840 may, or may not, be arranged in a periodic pattern. In one embodiment, the first device structure 840 may include a memory array such as a three-dimensional array of memory elements including a two-dimensional array of memory stack structures within which memory elements are vertically stacked. In such cases, the electrically active nodes within the first device structure 840 can include drain regions connected to a top end of a respective vertical semiconductor channel in a respective memory stack structure. The first device structure 840 may have a planar top surface that is parallel to the top surface of the first substrate 808.

A first etch stop dielectric layer 850 can be optionally formed over the top surface of the first device structure 840. The first etch stop dielectric layer 850 includes an etch stop dielectric material having a higher etch resistivity than the dielectric material to be subsequently deposited over the first etch stop dielectric layer 850. For example, the first etch stop dielectric layer 850 includes silicon nitride or a dielectric metal oxide such as aluminum oxide. The thickness of the first etch stop dielectric layer 850 can be in a range from 5 nm to 30 nm, although lesser and greater thicknesses can also be employed.

A first via-level dielectric layer 872 can be deposited over the top surface of the first etch stop dielectric layer 850. The first via-level dielectric layer 872 includes a dielectric material such as undoped silicate glass (i.e., silicon oxide), a doped silicate glass, or organosilicate glass. The thickness of the first via-level dielectric layer 872 can be in a range from 100 nm to 600 nm, although lesser and greater thicknesses can also be employed.

First via cavities 81 can be formed through the first via-level dielectric layer 872. For example, a photoresist layer can be applied over the top surface of the first via-level dielectric layer 872, and can be lithographically patterned to form discrete openings that overlie the electrically active nodes within the first device structure 840. An anisotropic etch process can be performed to form the first via cavities 81 underneath the discrete openings in the patterned photoresist layer. The photoresist layer can be removed, for example, by ashing.

Figure 2:
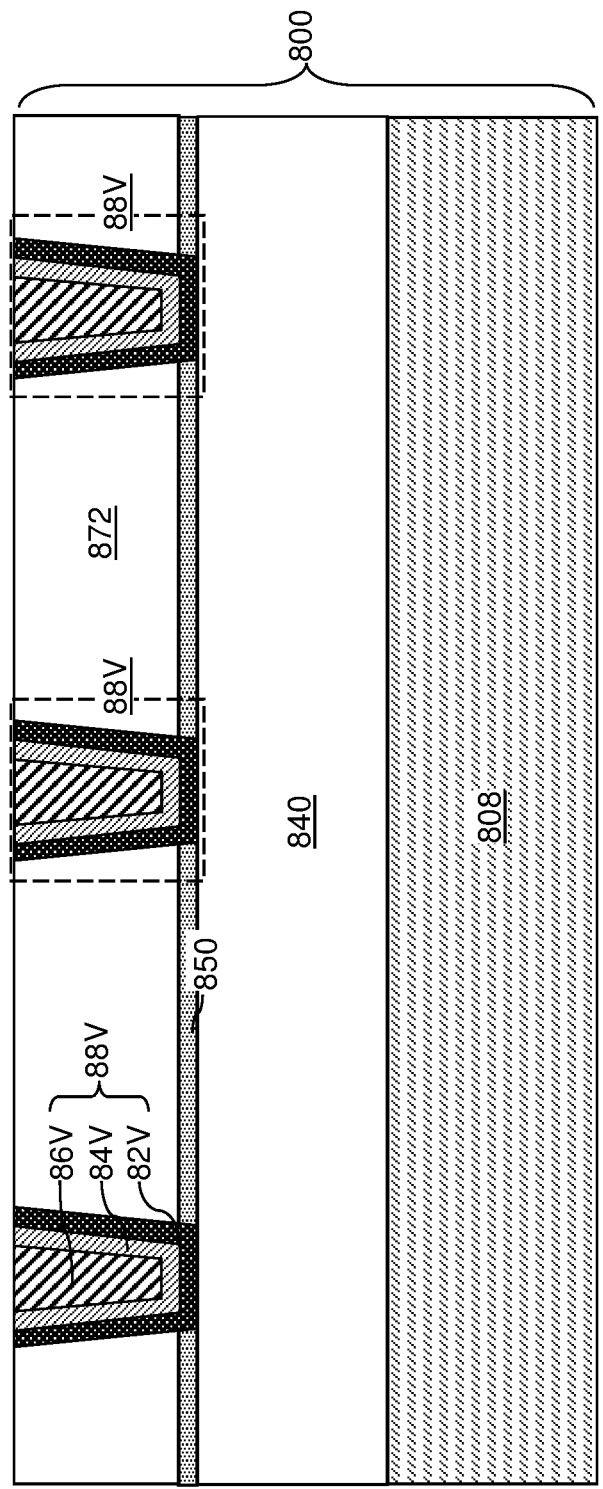
FIG. 2 is a vertical cross-sectional view of the first configuration of the first semiconductor die after formation of first conductive via structures according to the first embodiment of the present disclosure.

Referring to FIG. 2, at least one conductive material can be subsequently deposited in the first via cavities 81. For example, a continuous via-level metallic liner including a metallic nitride material such as TiN, TaN, or WN can be deposited by a conformal deposition process such as a chemical vapor deposition process. The thickness of the continuous via-level metallic liner can be in a range from 3 nm to 30 nm, although lesser and greater thicknesses can also be employed. An optional continuous via-level metallic seed layer can be optionally deposited by a non-conformal deposition process such as a physical vapor deposition process. The continuous via-level metallic seed layer includes at least one metallic fill material such as W, Cu, Mo, Ru, Co, Al, another elemental metal, or an intermetallic alloy. The thickness of the continuous via-level metallic seed layer on vertical or tapered surfaces can be in a range from 3 nm to 30 nm, although lesser and greater thicknesses can also be employed. A continuous via-level metallic fill layer can be deposited by a conformal deposition process (such as a chemical vapor deposition process) or a superconformal deposition process (such as electroplating or electroless plating) to fill remaining volumes of the first via cavities 81. The continuous via-level metallic fill layer can include Cu, CoW, CoWP, W, Mo, Ru, Co, Al, another elemental metal, or an intermetallic alloy. The material of the continuous via-level metallic fill layer may be the same as, or different from, the material of the continuous via-level metallic seed layer.

Excess portions of the at least one conductive material can be removed from above the horizontal plane including the top surface of the first via-level dielectric layer 872 by a planarization process. The planarization process can include a recess etch process and/or a chemical mechanical planarization process. Each remaining portion of the at least one conductive material comprises a conductive via structure, which is herein referred to as a first conductive via structure 88V. The first conductive via structure 88V can include a via-level metallic liner 82V, an optional via-level metallic seed layer 84V, and a via-level metallic fill portion 86V. The via-level metallic liner 82V is a remaining patterned portion of the continuous via-level metallic liner. The via-level metallic seed layer 84V is a remaining patterned portion of the continuous via-level metallic seed layer. The via-level metallic fill portion 86V is a remaining patterned portion of the continuous via-level metallic fill layer. Each contiguous combination of a via-level metallic seed layer 84V and a via-level metallic fill portion 86V constitutes a via-level metallic fill material portion (84V, 86V). Thus, each first conductive via structure 88V includes a combination of a via-level metallic liner 82V and a via-level metallic fill material portion (84V, 86V).

Figure 3:
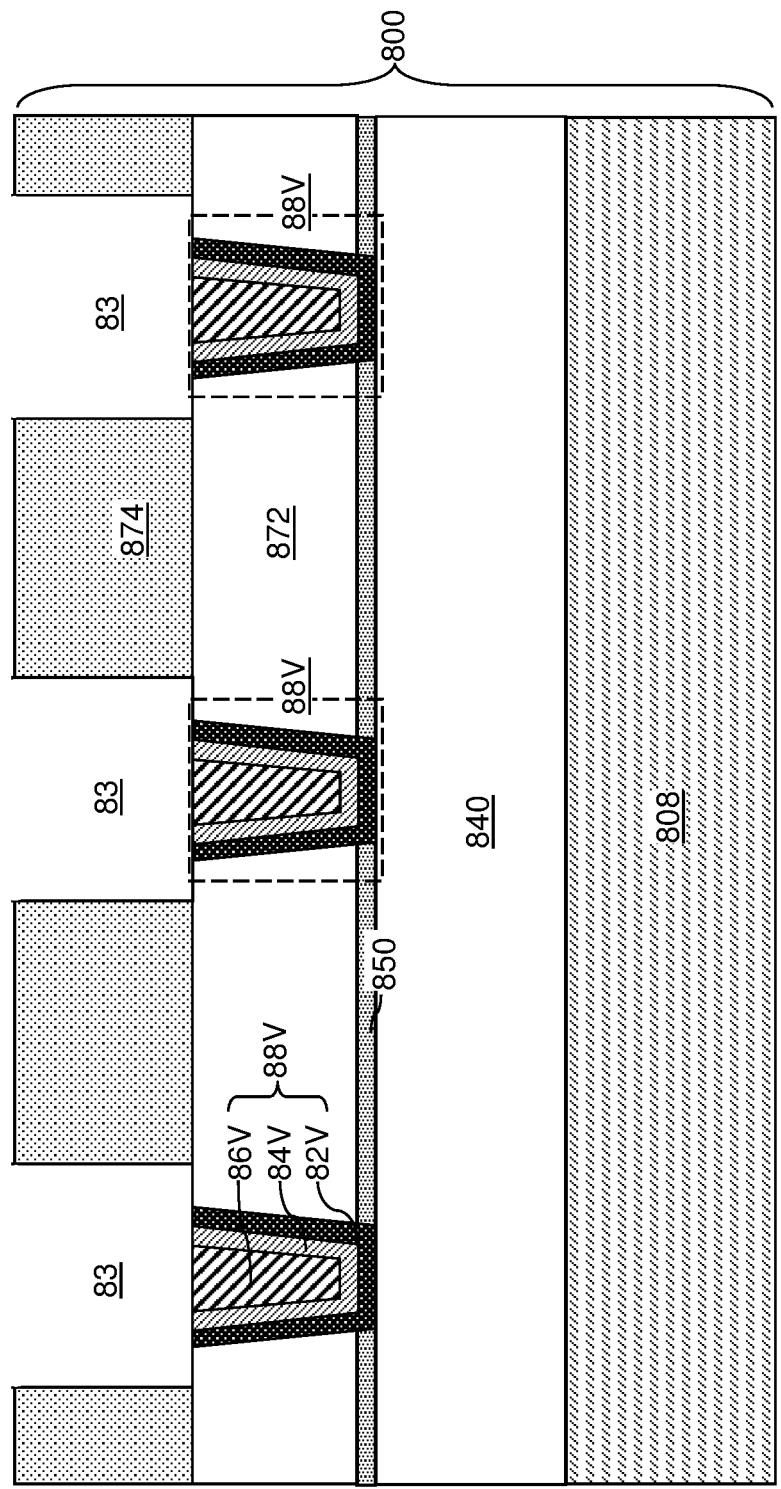
FIG. 3 is a vertical cross-sectional view of the first configuration of the first semiconductor die after formation of a first pad-level dielectric layer and first pad cavities according to the first embodiment of the present disclosure.

Referring to FIG. 3, a first pad-level dielectric layer 874 can be deposited over the first via-level dielectric layer 872. The first pad-level dielectric layer 874 may include a dielectric copper diffusion barrier material, such as a silicon carbide nitride (i.e., silicon carbonitride, SiCN) material. The SiCN material may contain any suitable atomic carbon to nitrogen ratio, such as a ratio of 1:4 to a ratio of 4:1. The first pad-level dielectric layer 874 can be deposited by a conformal or a non-conformal deposition process. For example, the first pad-level dielectric layer 874 can be formed by a plasma-enhanced chemical vapor deposition process. The thickness of the first pad-level dielectric layer 874 can be in a range from 100 nm to 600 nm, although lesser and greater thicknesses can also be employed.

A photoresist layer (not shown) can be applied over the top surface of the first pad-level dielectric layer 874, and can be lithographically patterned to form pad-shaped openings overlying a respective one of the first conductive via structures 88V. An anisotropic etch process can be performed employing the patterned photoresist layer as an etch mask layer. The pattern in the photoresist layer can be transferred through the first pad-level dielectric layer 874 by an anisotropic etch process to form first pad cavities 83. The first via-level dielectric layer 872 can be employed as an etch stop layer for the anisotropic etch process. A top surface of at least one first conductive via structure 88V can be physically exposed at the bottom of each first pad cavity 83. The maximum lateral dimension of each pad cavity 83 can be in a range from 2 microns to 100 microns, such as from 4 microns to 50 microns, although lesser and greater lateral dimensions can also be employed. Each first pad cavity 83 can have a horizontal cross-sectional shape of a polygon (such as a rectangle), a rounded polygon, a circle, an ellipse, or any other curvilinear two-dimensional shape having a closed periphery.

The sidewalls of the first pad cavities 83 can comprise surface of the material of the first pad-level dielectric layer 874, which may be a silicon carbide nitride material. The sidewalls of the first pad cavities 83 can be vertical, or may have a taper angle that is less than 20 degrees relative to the vertical direction. For example, the taper angle may be in a range from 0.1 degree to 5 degrees. A top surface of the first via-level dielectric layer 872 and a top surface of a first conductive via structure 88V can be physically exposed at the bottom of each first pad cavity 83.

Figure 4:
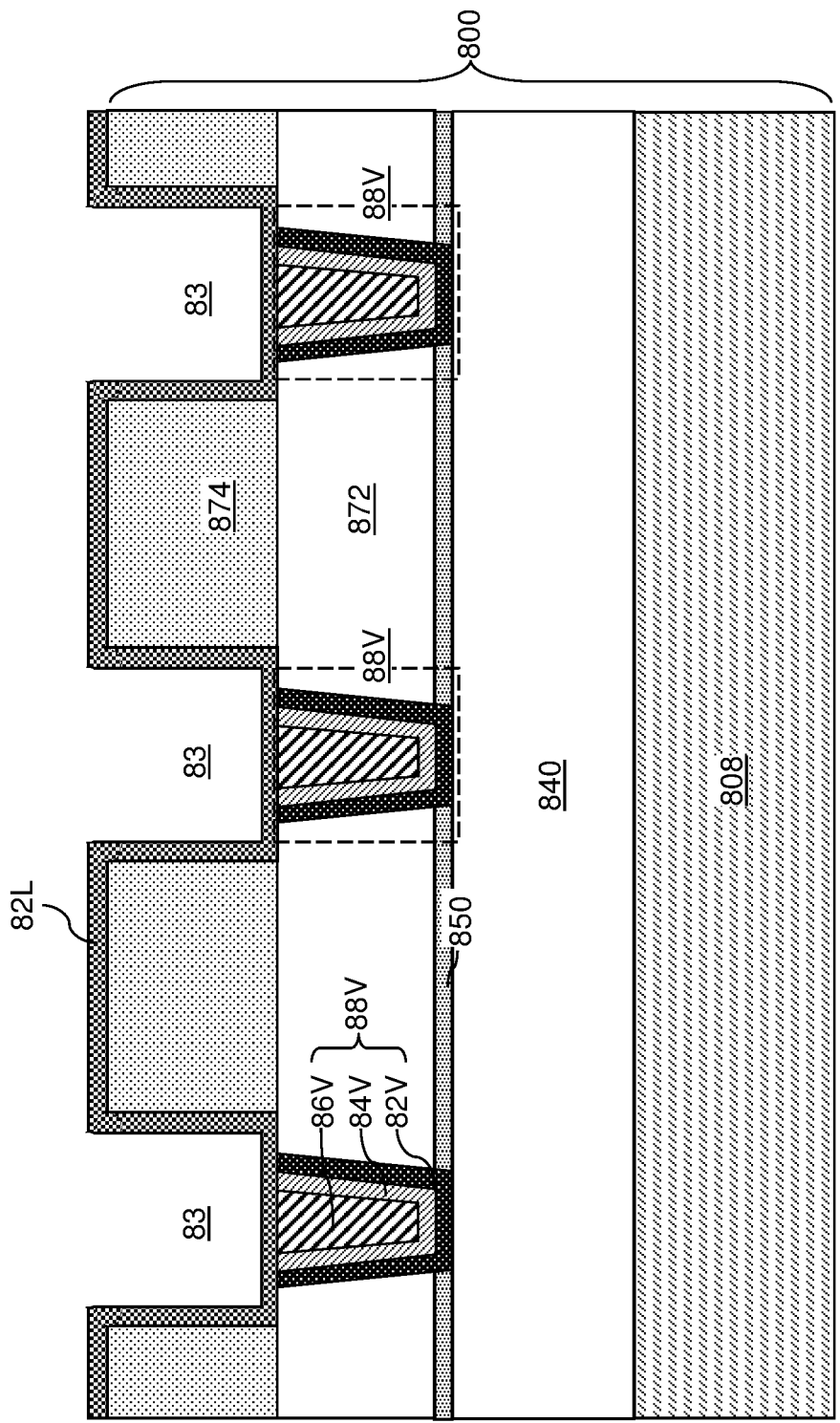
FIG. 4 is a vertical cross-sectional view of the first configuration of the first semiconductor die after formation of a continuous metallic liner according to the first embodiment of the present disclosure.

Referring to FIG. 4, a continuous pad-level metallic liner 82L including a metallic nitride material such as TiN, TaN, or WN can be deposited by a conformal deposition process such as a chemical vapor deposition process. The thickness of the continuous pad-level metallic liner 82L can be in a range from 3 nm to 30 nm, although lesser and greater thicknesses can also be employed.

Figure 5:
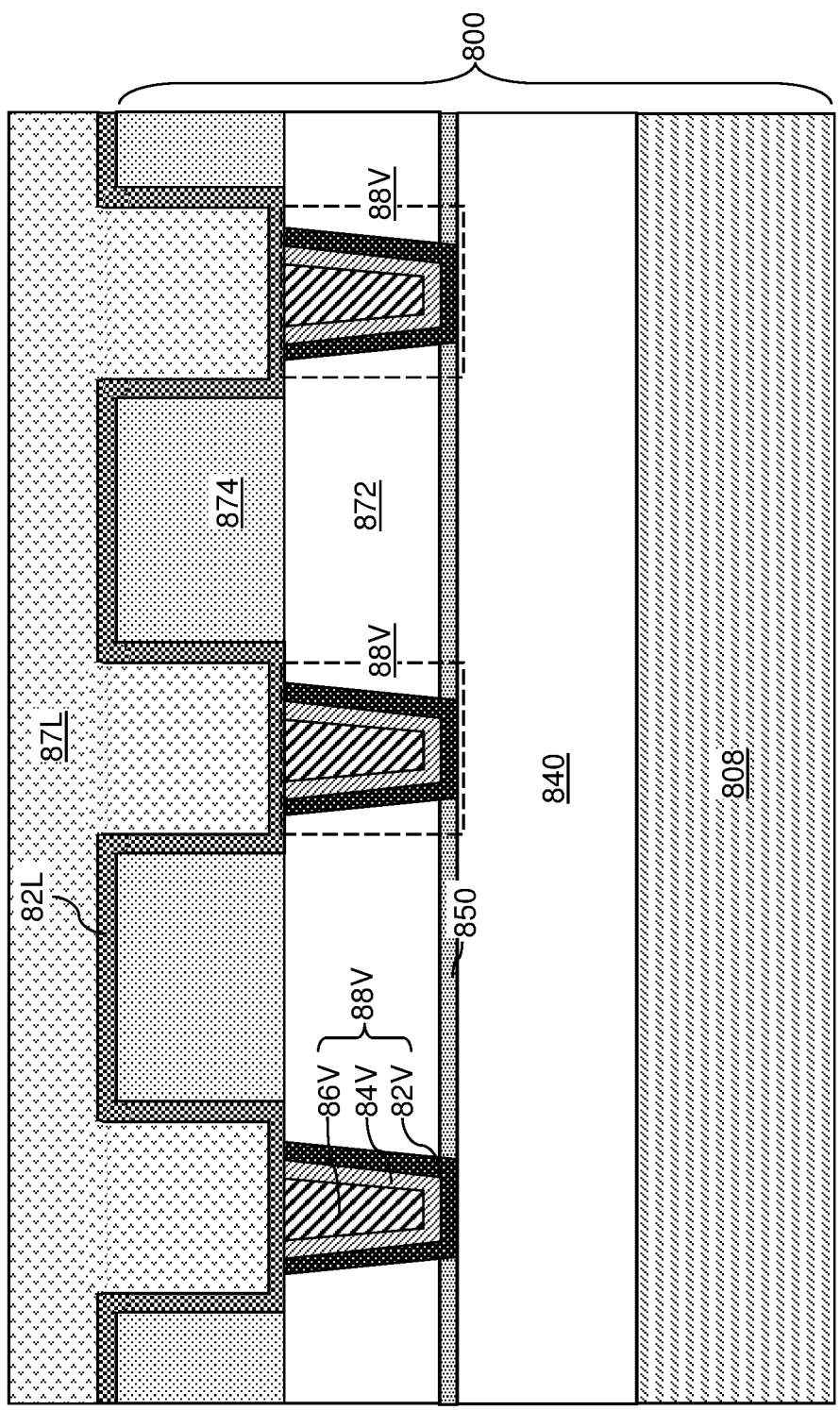
FIG. 5 is a vertical cross-sectional view of the first configuration of the first semiconductor die after formation of a masking material layer according to the first embodiment of the present disclosure.

Referring to FIG. 5, a masking material layer 87L can be formed over the continuous pad-level metallic liner 82L to fill the entire volume of each first pad cavity 83. The masking material layer 87L include a material that can be employed as an etch mask material during a subsequent etch process. For example, the masking material layer 87L can include a polymer material such as polyimide, a semiconductor material such as amorphous silicon, or a self-planarizing material, such as flowable oxide (FOX), spin-on glass (SOG) and/or spin-on carbon. The masking material layer 87L can include a self-planarizing material, or may be planarized to provide a horizontal surface.

Figure 6:
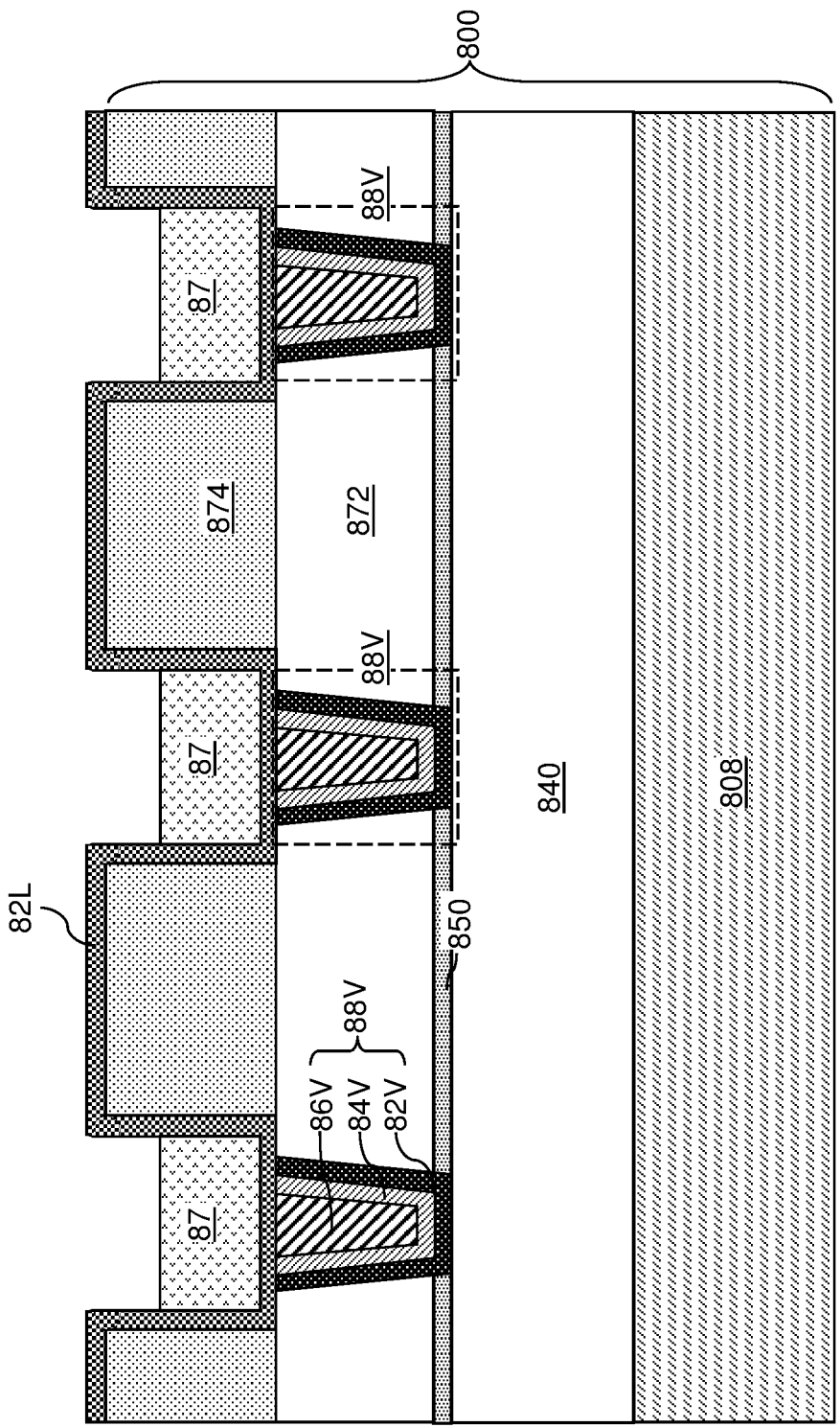
FIG. 6 is a vertical cross-sectional view of the first configuration of the first semiconductor die after formation of masking material portions according to the first embodiment of the present disclosure.

Referring to FIG. 6, the material of the masking material layer 87L can be vertically recessed to remove a horizontally-extending portion of the masking material layer from above the horizontal plane including the topmost surface of the continuous pad-level metallic liner 82L. The material of the masking material layer 87L can be further recessed such that the top surfaces of remaining portions of the masking material layer 87L are vertically recessed below the horizontal plane including the top surface of the first pad-level dielectric layer 874. Each remaining portion of the material of the masking material layer 87L is herein referred to as a masking material portion 87. A vertical recess distance of the top surfaces of the masking material portions 87 relative to the horizontal plane including the top surface of the first pad-level dielectric layer 874 can be in a range from 10% to 90%, such as from 20% to 80% and/or from 30% to 70%, of a vertical distance between the horizontal plane and a horizontal surface of the continuous pad-level metallic liner 82L that contacts the first via-level dielectric layer 872.

Figure 7:
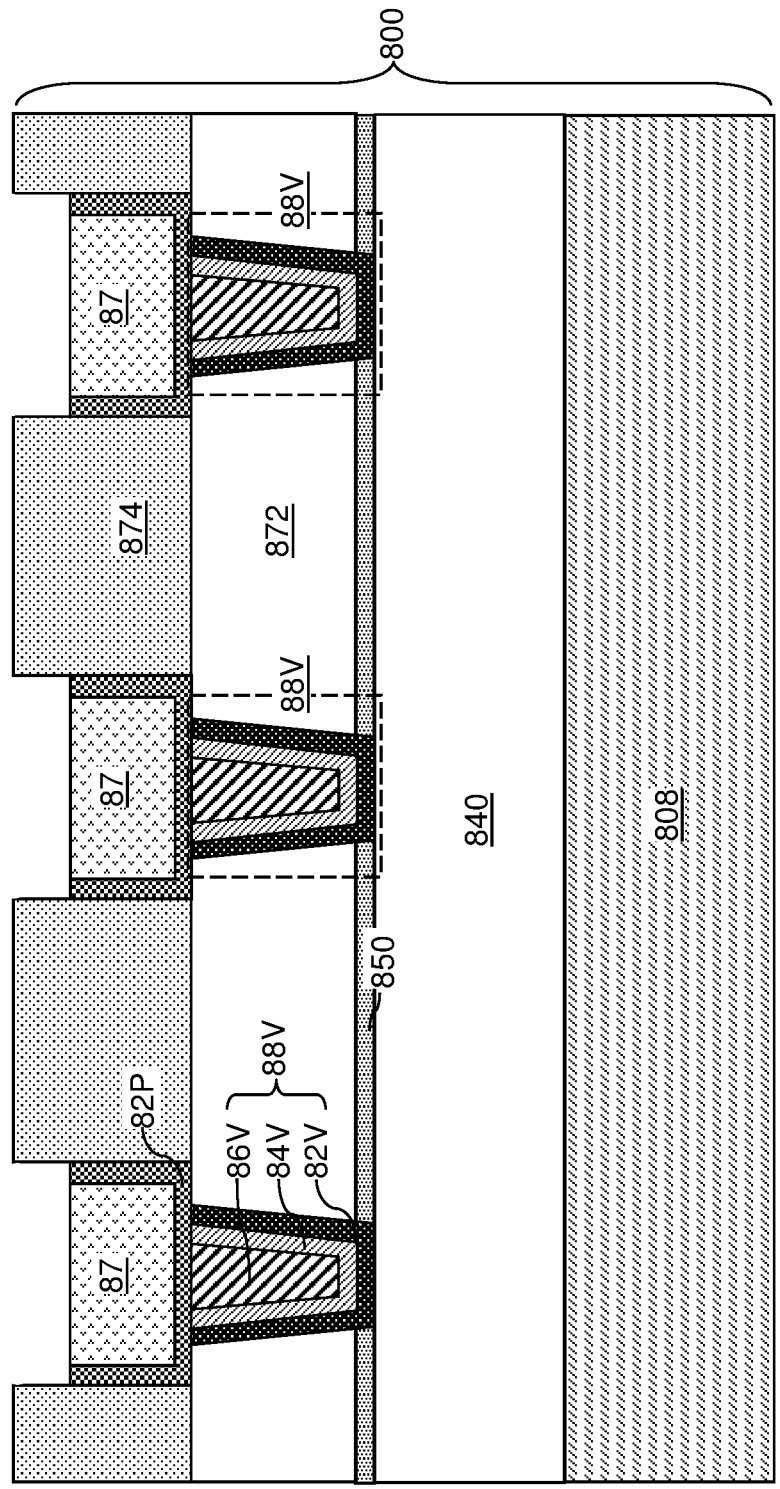
FIG. 7 is a vertical cross-sectional view of the first configuration of the first semiconductor die after formation of metallic liners according to the first embodiment of the present disclosure.

Referring to FIG. 7, an etch process can be performed to etch unmasked portions of the continuous pad-level metallic liner 82L, i.e., the portions of the continuous pad-level metallic liner 82L that are not masked by the masking material portions 87. For example, a wet etch process that etches the metallic material of the continuous pad-level metallic liner 82L selective to the material of the first pad-level dielectric layer 874 can be performed to isotropically etch the unmasked portions of the continuous pad-level metallic liner 82L. Each remaining patterned portion of the continuous pad-level metallic liner 82L is herein referred to as a pad-level metallic liner 82P. Each pad-level metallic liner 82P can have a respective top surface that is vertically recessed below the horizontal plane including the top surface of the first pad-level dielectric layer 874. The vertical recess distance of each pad-level metallic liner 82P relative to the horizontal plane including the top surface of the first pad-level dielectric layer 874 can be in a range from 10% to 90%, such as from 20% to 80% and/or from 30% to 70%, of the vertical distance between the horizontal plane including the top surface of the first pad-level dielectric layer 874 and the horizontal plane including the interfaces between the pad-level metallic liners 82P and the first via-level dielectric layer 872. Each pad-level metallic liner 82P can have a horizontally-extending portion that contacts a first conductive via structure 88V and at least one vertically-extending portion, which may be a single vertically-extending portion (such as a cylindrical vertically-extending portion) or a plurality of vertically-extending portions (which may be located on sidewalls of a pad-level cavity having a polygonal horizontal cross-sectional shape).

Figure 8:
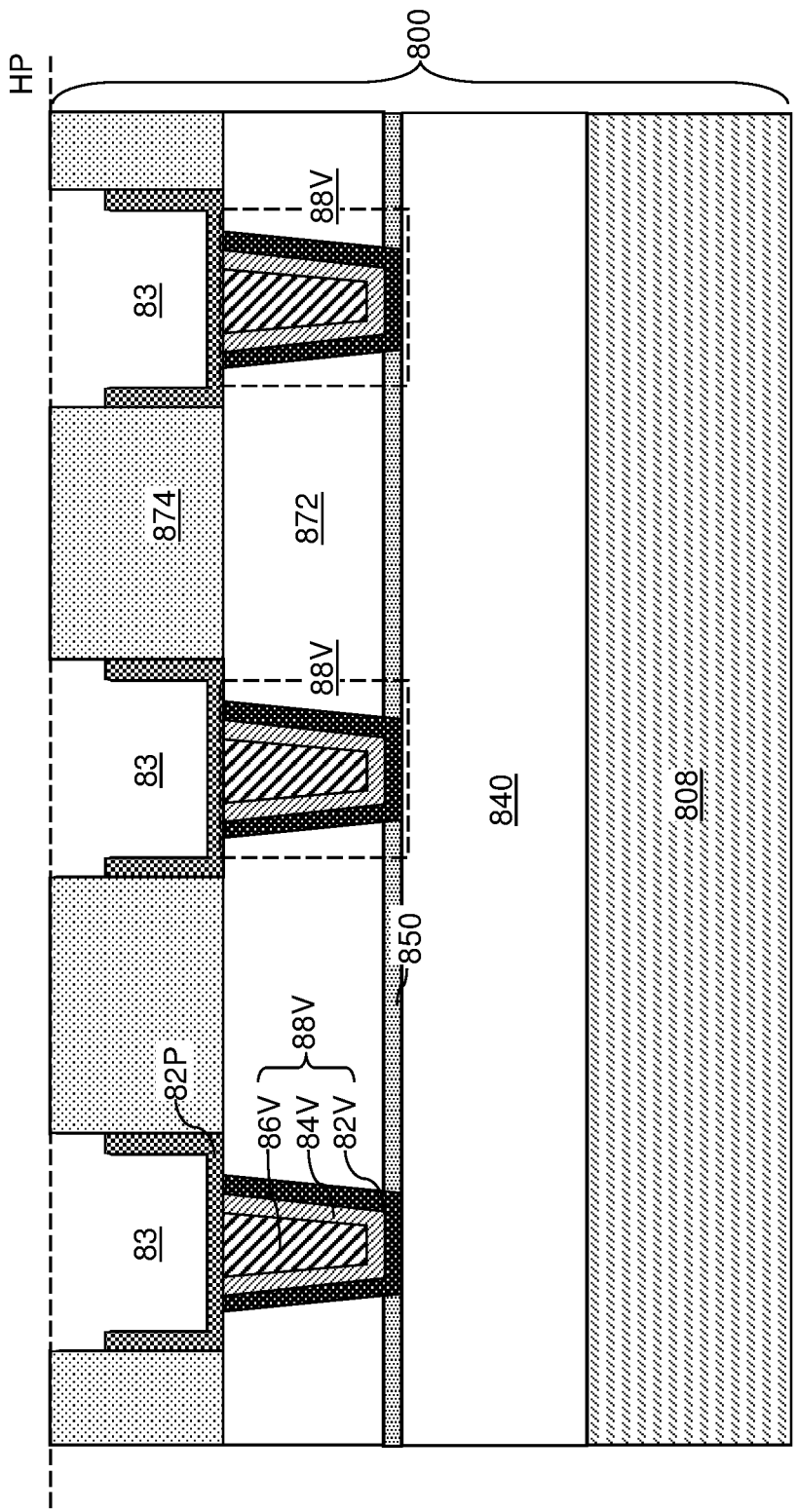
FIG. 8 is a vertical cross-sectional view of the first configuration of the first semiconductor die after removal of the masking material portions according to the first embodiment of the present disclosure.

Referring to FIG. 8, the masking material portions 87 can be removed selective to the materials of the pad-level metallic liners 82P and the first pad-level dielectric layer 874. For example, masking material portions 87 can be removed by a wet etch process or dissolution in a solvent without etching the materials of the pad-level metallic liners 82P and the first pad-level dielectric layer 874. The material composition of the pad-level metallic liners 82P may be the same as, or may be different from, the material composition of the via-level metallic liners 82V. The thickness of the pad-level metallic liners 82P may be the same as, or may be different from, the thickness of the via-level metallic liners 82V.

The pad-level metallic liners 82P are formed in the first pad cavities 83. Each of the pad-level metallic liners 82P is vertically recessed from the horizontal plane HP including the top surface of the first pad-level dielectric layer 874 toward the first substrate 808. Because the top surface of the first pad-level dielectric layer 874 is distal from the first substrate 808, the top surface of the first pad-level dielectric layer 874 is herein referred to as a horizontal distal surface of the first pad-level dielectric layer 874. In one embodiment, the pad-level metallic liners 82P comprise, and/or consist of, a metallic nitride material.

Figure 9:
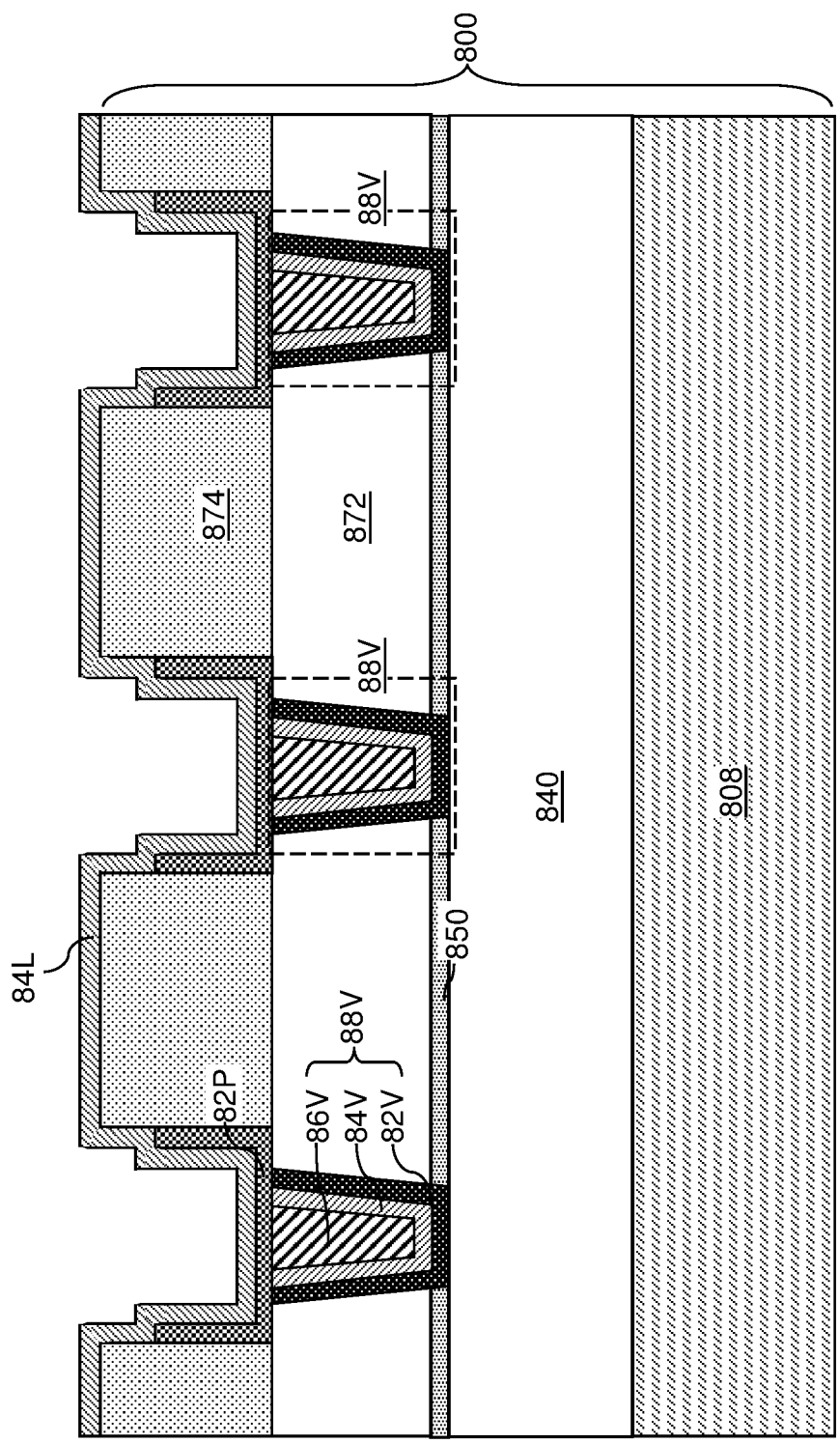
FIG. 9 is a vertical cross-sectional view of the first configuration of the first semiconductor die after formation of a metallic seed layer according to the first embodiment of the present disclosure.

Referring to FIG. 9, a continuous pad-level metallic seed layer 84L can be optionally deposited by a non-conformal deposition process such as a physical vapor deposition process. The continuous pad-level metallic seed layer 84L includes at least one metallic fill material such as W, Cu, Mo, Ru, Co, Al, another elemental metal, or an intermetallic alloy. The thickness of the continuous pad-level metallic seed layer 84L on vertical or tapered surfaces can be in a range from 3 nm to 30 nm, although lesser and greater thicknesses can also be employed. The continuous pad-level metallic seed layer 84L can be formed on physically exposed surfaces of the pad-level metallic liners 82P, on physically exposed portions of the sidewalls of the first pad-level dielectric layer 874, and over the top surface of the first pad-level dielectric layer 874.

Figure 10:
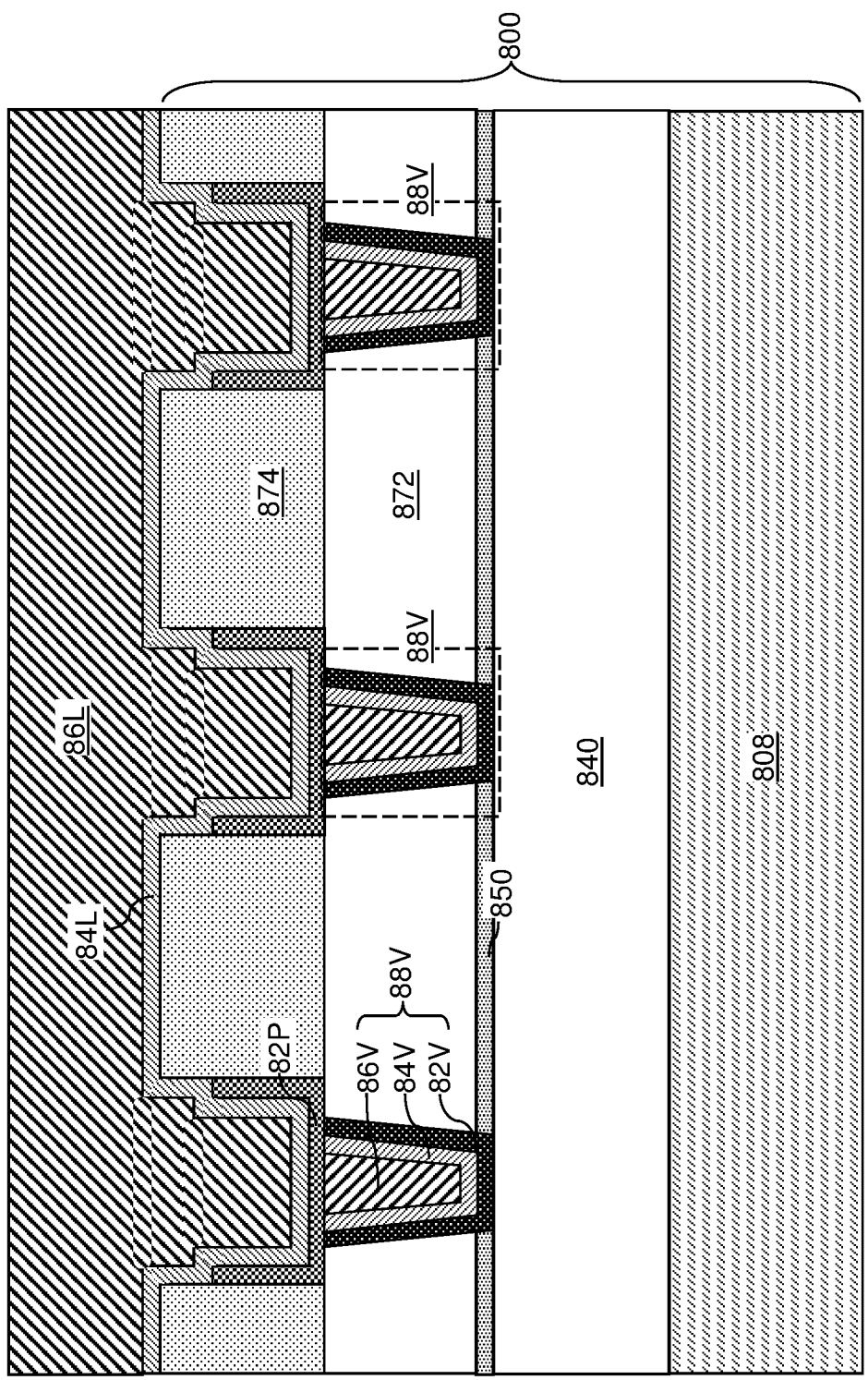
FIG. 10 is a vertical cross-sectional view of the first configuration of the first semiconductor die after formation of a metallic fill layer according to the first embodiment of the present disclosure.

Referring to FIG. 10, a continuous pad-level metallic fill layer 86L can be deposited by a conformal deposition process (such as a chemical vapor deposition process) or a superconformal deposition process (such as electroplating or electroless plating) to fill remaining volumes of the first pad cavities 83. In one embodiment, the continuous pad-level metallic fill layer 86L can be formed by electroplating a copper-containing material on the continuous pad-level metallic seed layer 84L. The continuous pad-level metallic fill layer can include Cu or a copper alloy. The material of the continuous pad-level metallic fill layer 86L may be the same as, or different from, the material of the continuous pad-level metallic seed layer 84L. In one embodiment, the material of the continuous pad-level metallic fill layer 86L may consist essentially of copper or a copper alloy in which the atomic percentage of copper is at least 50%, and/or at least 70%, and/or at least 90%. The composition of the material of the continuous pad-level metallic fill layer 86L may be the same as, or may be different from, the composition of the material of the via-level metallic fill material portions 86V.

Figure 11:
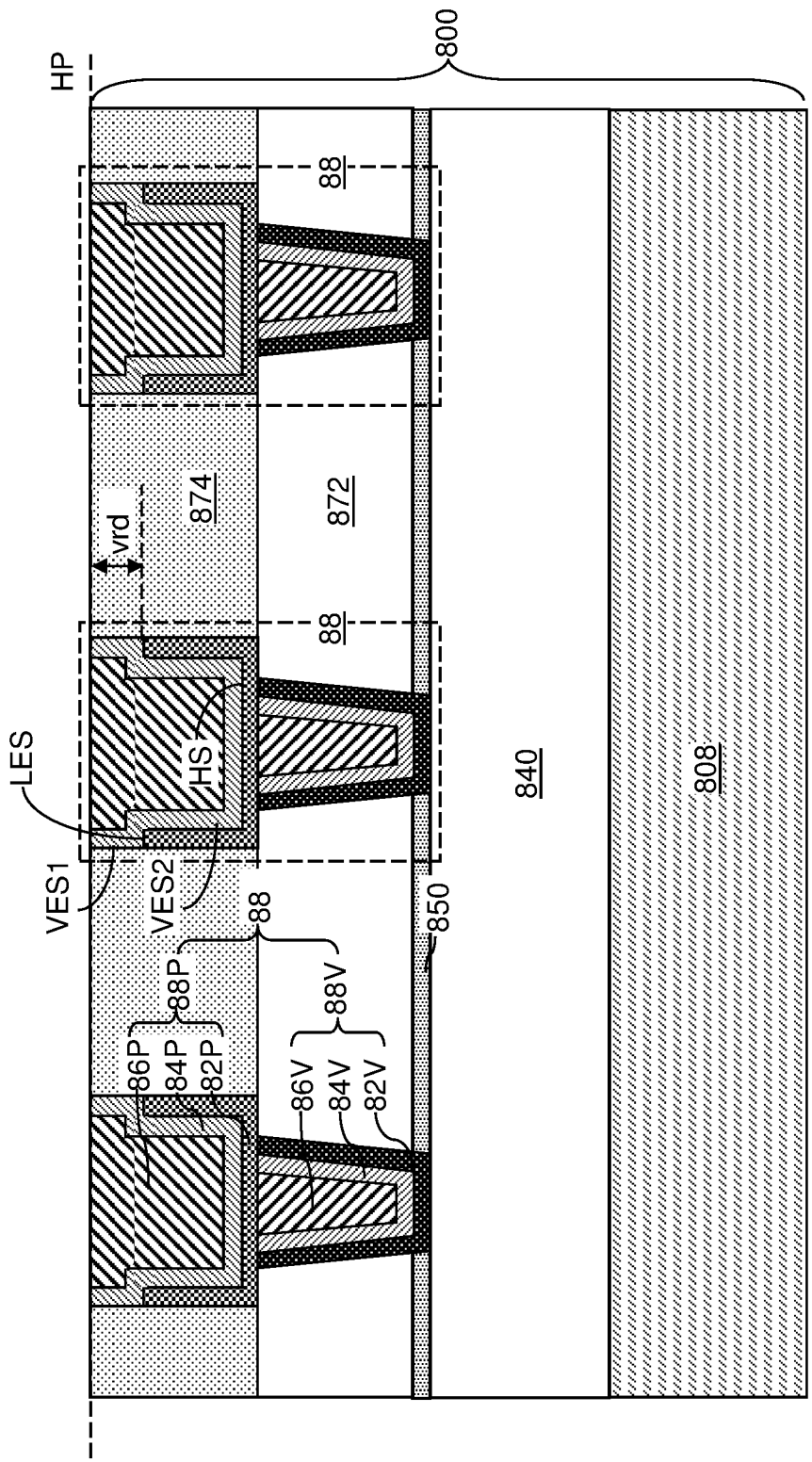
FIG. 11 is a vertical cross-sectional view of the first configuration of the first semiconductor die after formation of first bonding structures according to the first embodiment of the present disclosure.

Referring to FIG. 11, excess portions of the continuous pad-level metallic fill layer 86L and the optional continuous pad-level metallic seed layer 84L can be removed from above the horizontal plane HP including the top surface (i.e., a horizontal distal surface) of the first pad-level dielectric layer 874 by a planarization process. The planarization process can include a chemical mechanical planarization (i.e., chemical mechanical polishing ("CMP")) process. Each remaining portion of the at least one conductive material comprises a metallic bonding pad, which is herein referred to as a first metallic bonding pad 88P. The first metallic bonding pad 88P can include a pad-level metallic liner 82P, an optional pad-level metallic seed layer 84P, and a pad-level metallic fill portion 86P. The pad-level metallic liner 82P is a remaining patterned portion of the continuous pad-level metallic liner 82L. The pad-level metallic seed layer 84P is a remaining patterned portion of the continuous pad-level metallic seed layer 84L. The pad-level metallic fill portion 86P is a remaining patterned portion of the continuous pad-level metallic fill layer 86L.

First bonding structures 88 are formed in the first via-level dielectric layer 872 and in the first pad-level dielectric layer 874. Each first bonding structure 88 comprises a respective first metallic bonding pad 88P and a respective first conductive via structure 88V. Each of the first bonding structures comprises a pad-level metallic fill material portion (84P, 86P) having a horizontal distal surface that is located within a horizontal plane HP including a horizontal distal surface of the first pad-level dielectric layer 874, and a pad-level metallic liner 82P laterally surrounding the pad-level metallic fill material portion (84P, 86P) and is vertically spaced from the horizontal plane HP by a vertical recess distance vrd. Each contiguous combination of a pad-level metallic seed layer 84P and a pad-level metallic fill portion 86P constitutes a pad-level metallic fill material portion (84P, 86P). Thus, each first metallic bonding pad 88P includes a combination of a pad-level metallic liner 82P and a pad-level metallic fill material portion (84P, 86P).

The pad-level metallic fill material portions (84P, 86P) are formed in remaining volumes of the first pad cavities 83 that remain after formation of the pad-level metallic liners 82P. The pad-level metallic fill material portions (84P, 86P) can be formed directly on upper portions of the sidewalls of the first pad cavities 83. In one embodiment, the pad-level metallic fill material portions (84P, 86P) comprise copper. Each pad-level metallic liner 82P comprises a horizontally-extending portion contacting a horizontal surface of a pad-level metallic fill material portion (84P, 86P), and a vertically-extending portion adjoined to a periphery of the horizontally-extending portion and contacting a sidewall of the pad-level metallic fill material portion (84P, 86P). In one embodiment, the entirety of a sidewall of each pad-level metallic fill material portion (84P, 86P) may contact the first pad-level dielectric layer 874.

Presence of a metallic liner in proximity to a metallic fill material can cause edge recesses at a periphery of a remaining portion of the metallic fill material adjacent to the metallic liner. For example, if copper filling a cavity lined with a metallic liner material (such as TiN) is planarized employing a chemical mechanical planarization process, then a remaining portion of copper may have a peripheral recess that adjoins remaining sidewalls of the metallic liner material. According to an aspect of the present disclosure, vertical recessing of the pad-level metallic liners 82P below the horizontal plane HP including the top surface of the first pad-level dielectric layer 874 has the effect of reducing or preventing formation of such collaterally formed recesses in the pad-level metallic fill material portions (84P, 86P) that remain after the planarization process. In other words, by vertically recessing the pad-level metallic liners 82P relative to the top surface of the first pad-level dielectric layer 874, undesirable recesses at peripheral regions of the pad-level metallic fill material portions (84P, 86P) can be reduced or avoided during the planarization process that removes excess portions of the metallic fill materials from above the horizontal plane including the top surface of the first pad-level dielectric layer 874. Furthermore, if the first pad-level dielectric layer 874 includes a dielectric copper diffusion barrier material, such as a silicon carbide nitride, then this dielectric diffusion barrier material may prevent or reduce copper migration into the first pad-level dielectric layer 874. Elimination or reduction of recesses and copper migration reduces or prevents electromigration and/or stress induced voids in the copper containing materials of the pad-level metallic fill material portions (84P, 86P) after formation of a bonded assembly and during operation of the bonded assembly.

Generally, the first semiconductor die 800 can include a first pad-level dielectric layer 874 overlying the at least one first semiconductor device in the first device structure 840, and first bonding structures comprising a respective first metallic bonding pad 88P embedded in the first pad-level dielectric layer 874. Each of the first bonding structures can comprise a metallic fill material portion (such as a pad-level metallic fill material portion (84P, 86P) having a horizontal distal surface that is located within a horizontal plane HP including a horizontal distal surface of the first pad-level dielectric layer 874, and a metallic liner (such as a pad-level metallic liner 82P) laterally surrounding the metallic fill material portion and is vertically spaced from the horizontal plane HP by a vertical recess distance vrd. As used herein, a "distal surface" refers to a surface that is distal from a reference structure, such as the first substrate 808, and a "proximal surface" refers to a surface that is proximal to the reference structure.

In one embodiment, the metallic liner (such as the pad-level metallic liner 82P) comprises: a horizontally-extending portion contacting a horizontal surface of the metallic fill material portion (such as the pad-level metallic fill material portions (84P, 86P)), and a vertically-extending portion adjoined to a periphery of the horizontally-extending portion and contacting a sidewall of the metallic fill material portion (such as the pad-level metallic fill material portion (84P, 86P)).

In one embodiment, a sidewall of the metallic fill material portion (such as the pad-level metallic fill material portion (84P, 86P)) has a stepped profile such that a laterally-extending segment LES of the sidewall connects a first vertically-extending segment VES1 of the sidewall that extends to the horizontal plane HP to a second vertically-extending segment VES2 of the sidewall that extends to the horizontally-extending portion HS of the metallic liner (such as the pad-level metallic liner 82P).

In one embodiment, the laterally-extending segment LES of the metallic fill material portion (such as the pad-level metallic fill material portion (84P, 86P)) contacts a distal surface of the metallic liner (such as the pad-level metallic liner 82P) that is most distal from the first substrate 808 of all surfaces of the metallic liner. In one embodiment, the vertical recess distance vrd can be in a range from 10% to 90% of a vertical distance between the horizontal plane HP and a proximal surface of the horizontally-extending portion of the metallic liner (which is located within a horizontal interface between the pad-level metallic liner 82P and the first via-level dielectric layer 872).

In one embodiment, a first vertically-extending segment VES1 of a stepped sidewall of the metallic fill material portion (such as the pad-level metallic fill material portion (84P, 86P)) and an outer sidewall of the metallic liner (such as the pad-level metallic liner 82P) are located within a two-dimensional plane that is vertical or has a taper angle less than 20 degrees relative to a vertical direction, and a second vertically-extending segment VES2 the stepped sidewall of the metallic fill material portion contacts an inner sidewall of the metallic liner, and is parallel to the two-dimensional plane.

In one embodiment, the metallic liners (such as the pad-level metallic liners 82P) comprise a metallic nitride material, and the metallic fill material portions (such as the pad-level metallic fill material portions (84P, 86P)) comprise copper. In one embodiment, a sidewall of the metallic fill material portion (such as the pad-level metallic fill material portion (84P, 86P)) contacts the first pad-level dielectric layer 874, and a sidewall of the metallic liner (such as the pad-level metallic liners 82P) contacts the first pad-level dielectric layer 874. In one embodiment, the first pad-level dielectric layer 874 comprises silicon carbide nitride. In one embodiment, conductive via structures (such as first conductive via structures 88V) can underlie the first bonding structures 88P, and can contact a horizontal surface of a respective one of the first bonding structures 88P.

The sidewalls of the first metallic bonding pads 88P can comprise surfaces of the material of the first pad-level dielectric layer 874, which may be surfaces of a silicon carbide nitride material. The sidewalls of the first metallic bonding pads 88P can be vertical, or may have a taper angle that is less than 20 degrees relative to the vertical direction. For example, the taper angle may be in a range from 0.1 degree to 5 degrees.

Figure 12:
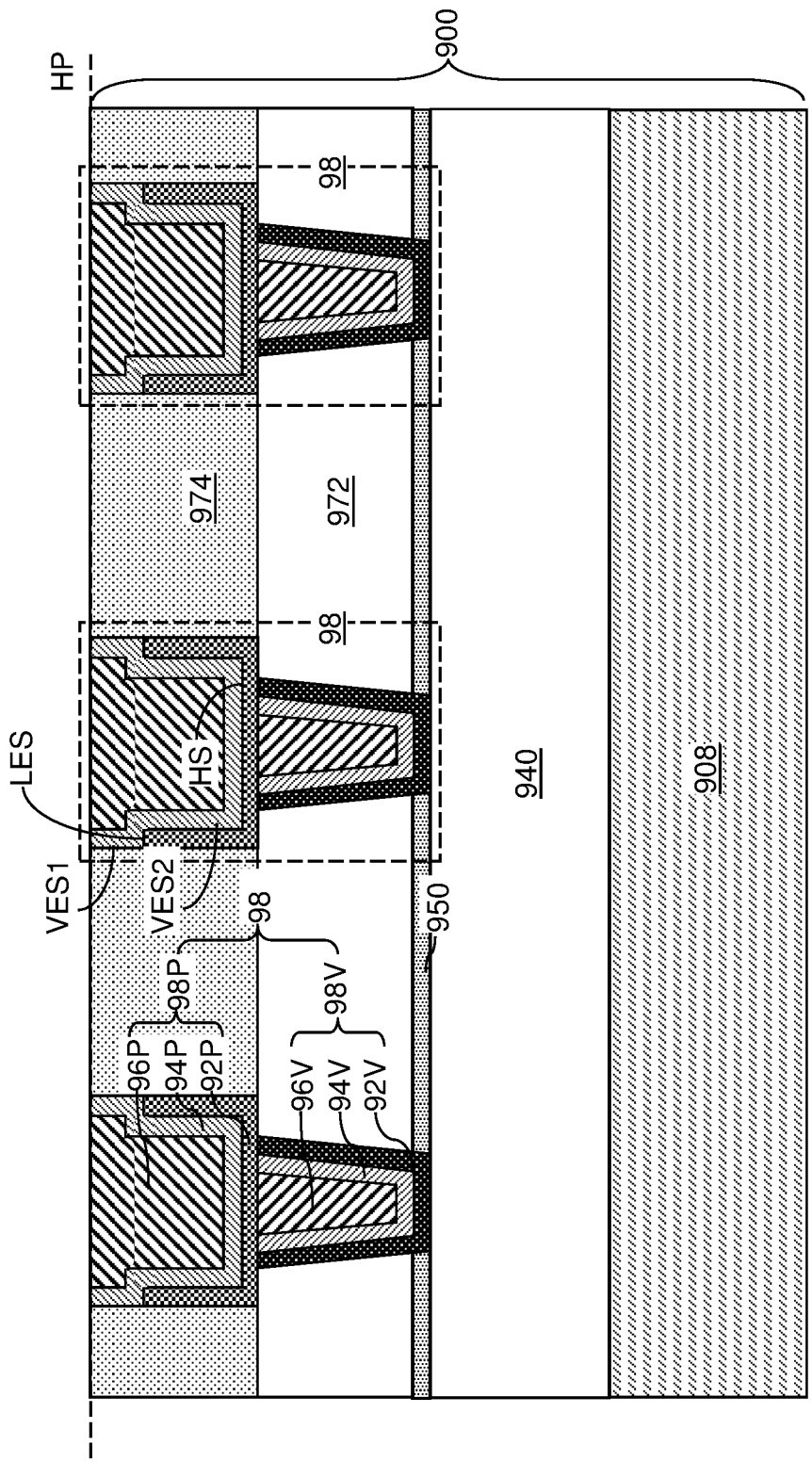
FIG. 12 is a vertical cross-sectional view of a first configuration of a second semiconductor die after formation of second bonding structures according to the first embodiment of the present disclosure.

Referring to FIG. 12, a first configuration of a second semiconductor die 900 according to the first embodiment of the present disclosure is illustrated. The second semiconductor die 900 can include a second substrate 908, a second device structure 940 including at least one second semiconductor device therein, a second etch stop dielectric layer 950, a second via-level dielectric layer 972, second conductive via structures 98V embedded within the second via-level dielectric layer 972, a second pad-level dielectric layer 974, and second metallic bonding pads 98P. Each second conductive via structure 98V can include a via-level metallic liner 92V, an optional via-level metallic seed layer 94V, and a via-level metallic fill portion 96V. Each second metallic bonding pad 98P can include a pad-level metallic liner 92P, an optional pad-level metallic seed layer 94P, and a pad-level metallic fill portion 96P, such as a copper containing portion.

The second etch stop dielectric layer 950 can have the same material composition and the same thickness range as the first etch stop dielectric layer 850. The second via-level dielectric layer 972 can have the same material composition and the same thickness range as the first via-level dielectric layer 872. The second pad-level dielectric layer 974 can have the same material composition and the same thickness range as the first pad-level dielectric layer 874. The via-level metallic liners 92V in the second semiconductor die 900 can include any material that can be employed for, and can have a thickness within a same thickness range as, the via-level metallic liners 82V in the first semiconductor die 800. The via-level metallic seed layers 94V in the second semiconductor die 900 can include any material that can be employed for, and can have a thickness within a same thickness range as, the via-level metallic seed layers 84V in the first semiconductor die 800. The via-level metallic fill portions 96V in the second semiconductor die 900 can include any material that can be employed for the via-level metallic fill portions 86V in the first semiconductor die 800. The pad-level metallic liners 92P in the second semiconductor die 900 can include any material that can be employed for, and can have a thickness within a same thickness range as, the pad-level metallic liners 82P in the first semiconductor die 800. The pad-level metallic seed layers 94P in the second semiconductor die 900 can include any material that can be employed for, and can have a thickness within a same thickness range as, the pad-level metallic seed layers 84P in the first semiconductor die 800. The pad-level metallic fill portions 96P in the second semiconductor die 900 can include any material that can be employed for the pad-level metallic fill portions 86P in the first semiconductor die 800. The portions of the second semiconductor die 900 located above the second semiconductor structure 940 may be formed employing the same manufacturing methods that are employed to form the portions of the first semiconductor die 800 above the first semiconductor structure 840.

As discussed above, presence of a metallic liner in proximity to a metallic fill material may cause edge recesses at a periphery of a remaining portion of the metallic fill material adjacent to the metallic liner. According to an aspect of the present disclosure, vertical recessing of the pad-level metallic liners 92P below the horizontal plane including the top surface of the second pad-level dielectric layer 974 has the effect of reducing or preventing formation of such collaterally formed grooves in the pad-level metallic fill material portions (94P, 96P) that remain after the planarization process. Elimination or reduction of recessed regions from the polished surfaces of the pad-level metallic fill material portions (94P, 96P) may reduce or prevent electromigration and/or stress induced voids in the copper containing material of the pad-level metallic fill material portions (94P, 96P) after formation of a bonded assembly and during usage of the bonded assembly.

Figure 13:
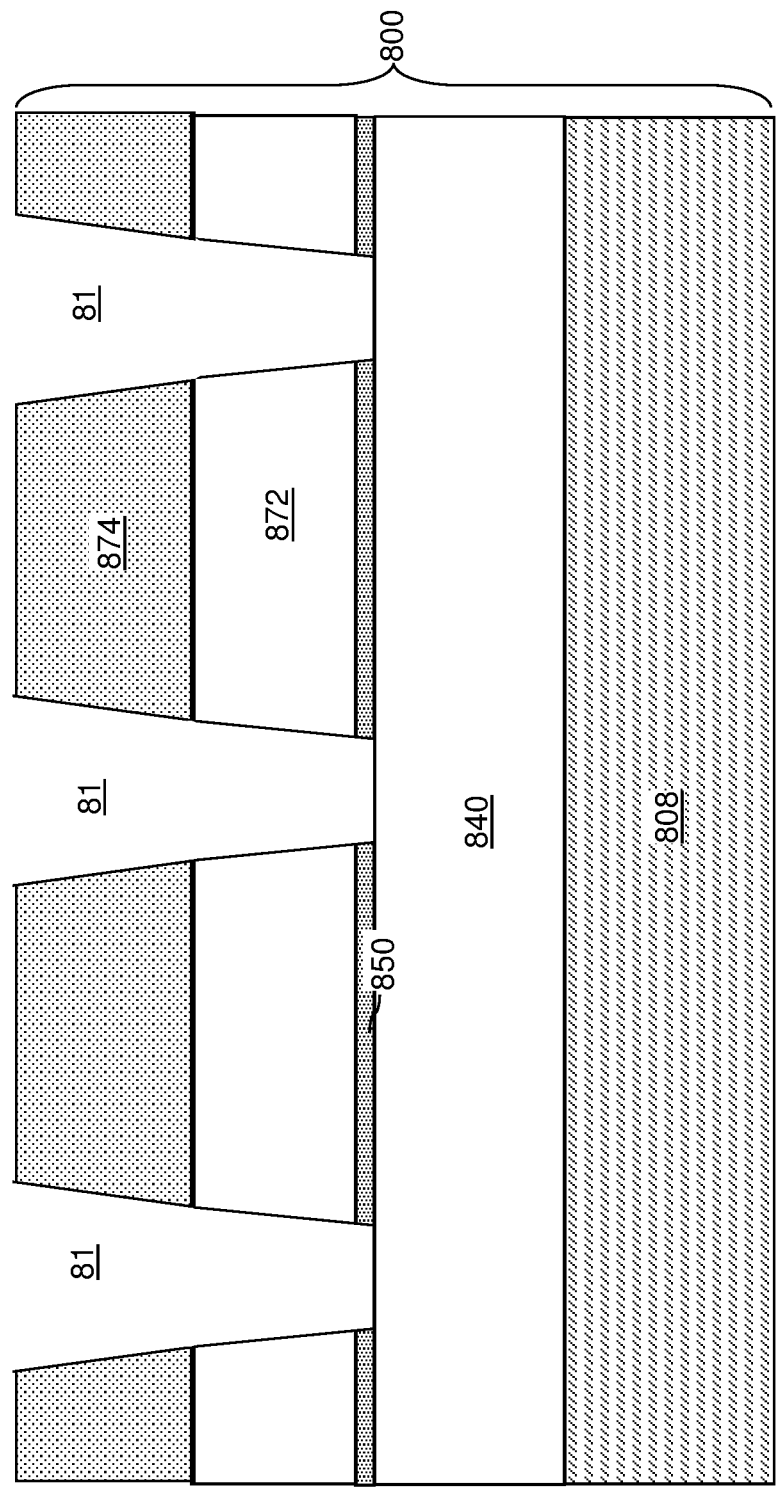
FIG. 13 is a vertical cross-sectional view of the second configuration of the first semiconductor die after formation of first conductive via structures according to the second embodiment of the present disclosure.

Referring to FIG. 13, a second configuration of the first semiconductor die 800 according to a second embodiment of the present disclosure is illustrated, in which a dual damascene process rather than a single damascene process may be used to form the bonding pads and the vias at the same time. The first semiconductor die 800 includes a first substrate 808 and a first device structure 840 formed over the first substrate 808. The first device structure 840 includes at least one first semiconductor device such as field effect transistors, a three-dimensional array of memory elements, or any other semiconductor device known in the art. The first device structure 840 may include at least one dielectric material layer at an upper portion thereof, and may include a plurality of electrically active nodes therein. The electrically active nodes of the first device structure 840 may, or may not, be arranged in a periodic pattern. In one embodiment, the first device structure 840 may include a memory array such as a three-dimensional array of memory elements including a two-dimensional array of memory stack structures within which memory elements are vertically stacked. In such cases, the electrically active nodes within the first device structure 840 can include drain regions connected to a top end of a respective vertical semiconductor channel in a respective memory stack structure. The first device structure 840 may have a planar top surface that is parallel to the top surface of the first substrate 808.

A first etch stop dielectric layer 850 can be optionally formed over the top surface of the first device structure 840. The first etch stop dielectric layer 850 can be the same as in the first embodiment. A first via-level dielectric layer 872 can be deposited over the top surface of the first etch stop dielectric layer 850. The first via-level dielectric layer 872 can be the same as in the first embodiment. A first pad-level dielectric layer 874 can be deposited over the first via-level dielectric layer 872. The first pad-level dielectric layer 874 may include a dielectric copper diffusion barrier material, such as a silicon carbide nitride (i.e., silicon carbonitride, SiCN) material. The first pad-level dielectric layer 874 can be deposited by a conformal or a non-conformal deposition process. For example, the first pad-level dielectric layer 874 can be formed by a plasma-enhanced chemical vapor deposition process. The thickness of the first pad-level dielectric layer 874 can be in a range from 100 nm to 600 nm, although lesser and greater thicknesses can also be employed.

A first photoresist layer (not shown) can be applied over the top surface of the first pad-level dielectric layer 874, and can be lithographically patterned to form via cavity shaped openings. An anisotropic etch process can be performed employing the patterned first photoresist layer as an etch mask layer. The pattern in the first photoresist layer can be transferred through the first pad-level dielectric layer 874 and the first via-level dielectric layer 872 to form first via cavities 81. The first etch stop dielectric layer 850 can be employed as an etch stop layer for the anisotropic etch process. The etch may then be continued with a different etching gas or liquid through the first etch stop dielectric layer 850 to the first device structure 840. The maximum lateral dimension of each first via cavity 81 can be in a range from 2 microns to 100 microns, such as from 4 microns to 50 microns, although lesser and greater lateral dimensions can also be employed. Each first via cavity 81 can have a horizontal cross-sectional shape of a polygon (such as a rectangle), a rounded polygon, a circle, an ellipse, or any other curvilinear two-dimensional shape having a closed periphery. The first photoresist layer can be removed, for example, by ashing.

The sidewalls of the first via cavities 81 can comprise surface of the material of the first pad-level dielectric layer 874, which may be a silicon carbide nitride material, the first pad-level dielectric layer 874, which may be a silicon oxide layer, and optionally the first etch stop dielectric layer 850, which may be a silicon nitride material. The sidewalls of the first via cavities 81 can be vertical, or may have a taper angle that is less than 20 degrees relative to the vertical direction. For example, the taper angle may be in a range from 0.1 degree to 5 degrees. A top surface of the first device structure 840 can be physically exposed at the bottom of each first via cavity 81.

Figure 14:
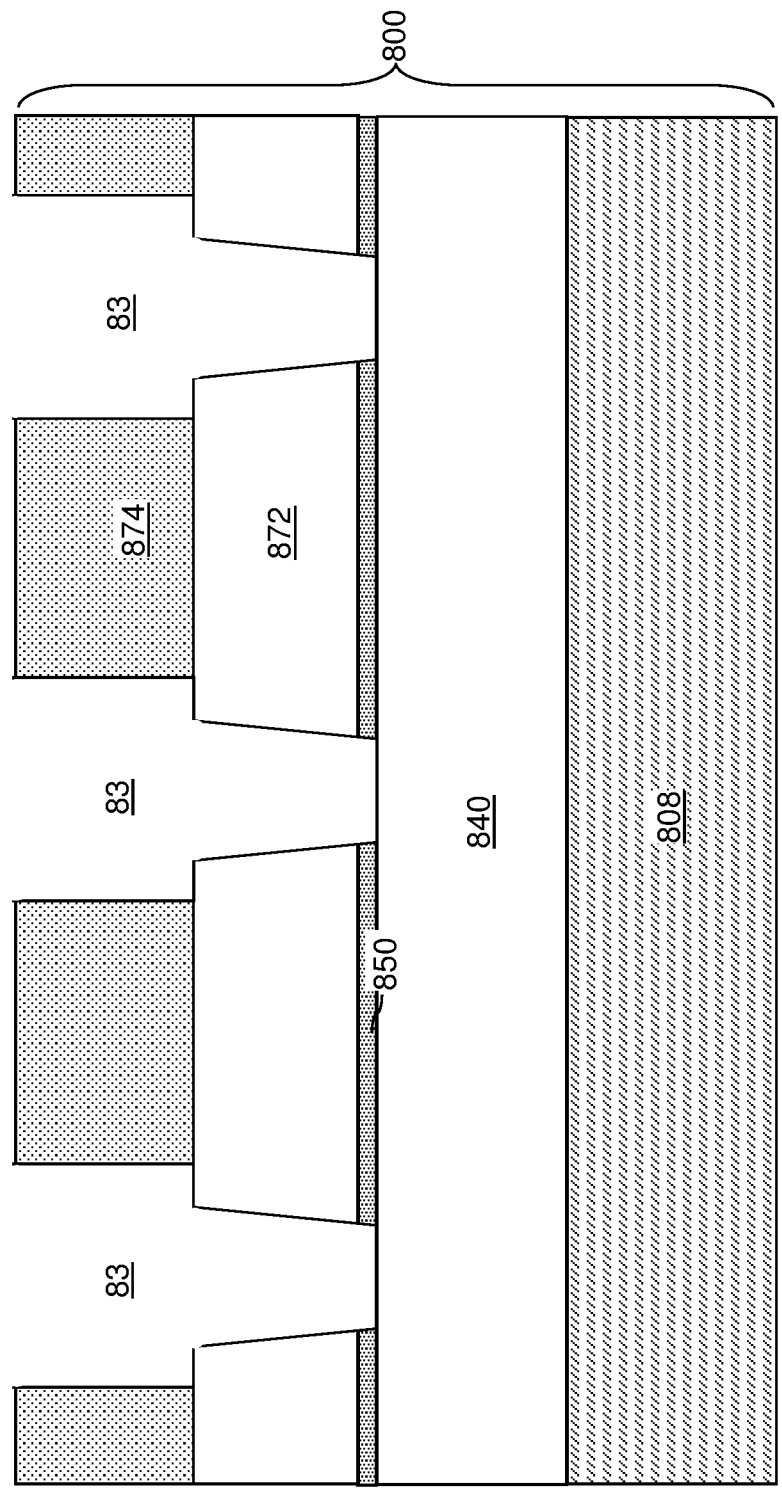
FIG. 14 is a vertical cross-sectional view of a second configuration of the first semiconductor die after formation of first pad cavities according to a second embodiment of the present disclosure.

Referring to FIG. 14, first pad cavities 83 can formed at the top portions of the first via cavities 81. A second photoresist layer (not shown) can be applied over the top surface of the first pad-level dielectric layer 874, and can be lithographically patterned to form pad cavity shaped openings which are wider than the via shaped openings. An anisotropic etch process can be performed employing the patterned second photoresist layer as an etch mask layer. The pattern in the photoresist layer can be transferred through the first pad-level dielectric layer 874 to widen the top portions of the via cavities 81 to form first pad cavities 83 in the top portions of the via cavities 81. The first pad cavities 83 can have a horizontal cross-sectional shape of a polygon (such as a rectangle), a rounded polygon, a circle, an ellipse, or any other curvilinear two-dimensional shape having a closed periphery. The sidewalls of the first pad cavities 83 can comprise surface of the material of the first pad-level dielectric layer 874, which may be a silicon carbide nitride material. The sidewalls of the first pad cavities 83 can be vertical, or may have a taper angle that is less than 20 degrees relative to the vertical direction. For example, the taper angle may be in a range from 0.1 degree to 5 degrees. The second photoresist layer can be removed, for example, by ashing.

Figure 15:
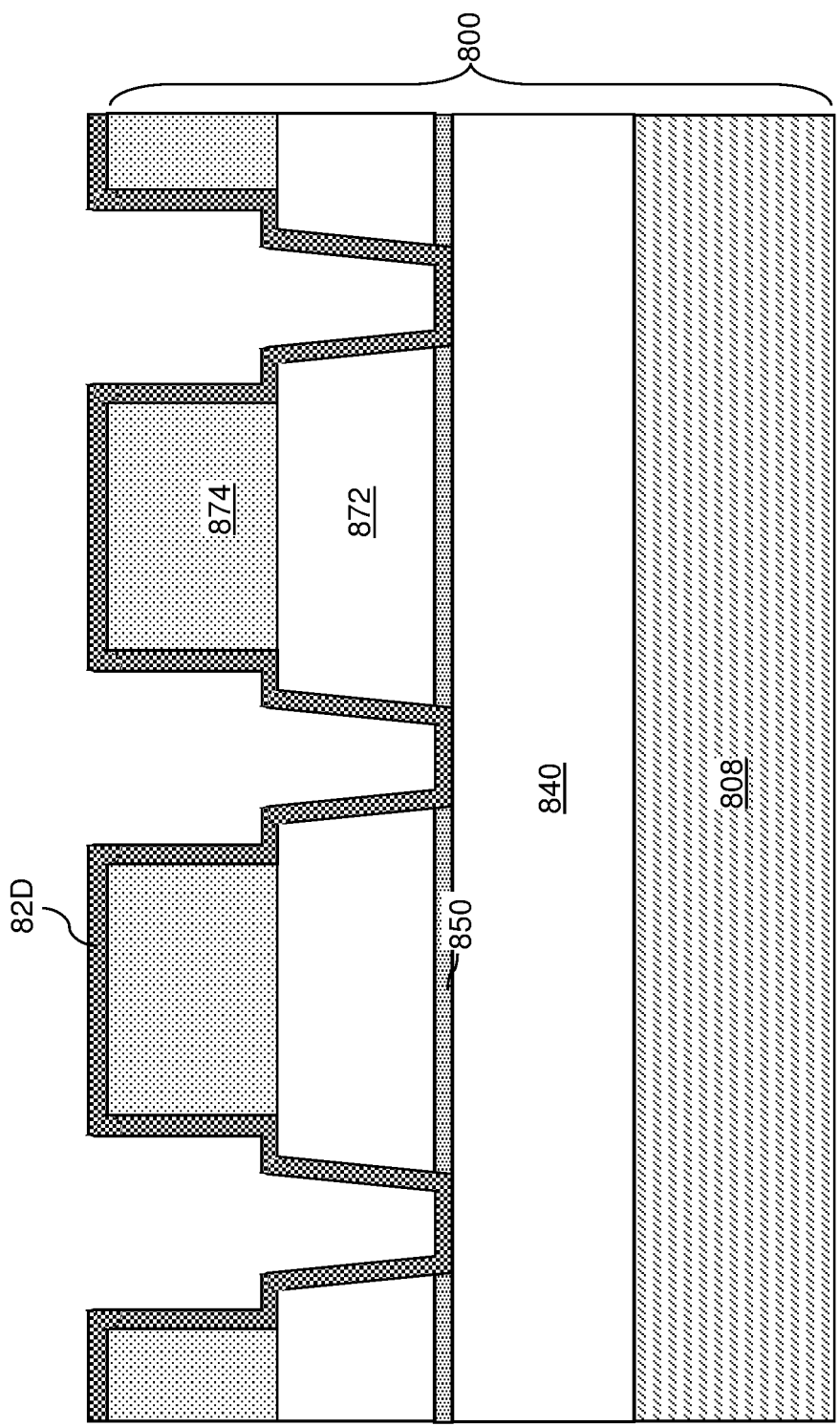
FIG. 15 is a vertical cross-sectional view of the second configuration of the first semiconductor die after formation of a continuous metallic liner according to the second embodiment of the present disclosure.

Referring to FIG. 15, a continuous pad-and-via-level metallic liner 82D including a metallic nitride material such as TiN, TaN, or WN can be deposited by a conformal deposition process such as a chemical vapor deposition process. The continuous pad-and-via-level metallic liner 82D can be deposited on the physically exposed surfaces of the first etch stop dielectric layer 850, the first via-level dielectric layer 872 and the first pad-level dielectric layer 874. The thickness of the continuous pad-and-via-level metallic liner 82D can be in a range from 3 nm to 30 nm, although lesser and greater thicknesses can also be employed.

Figure 16:
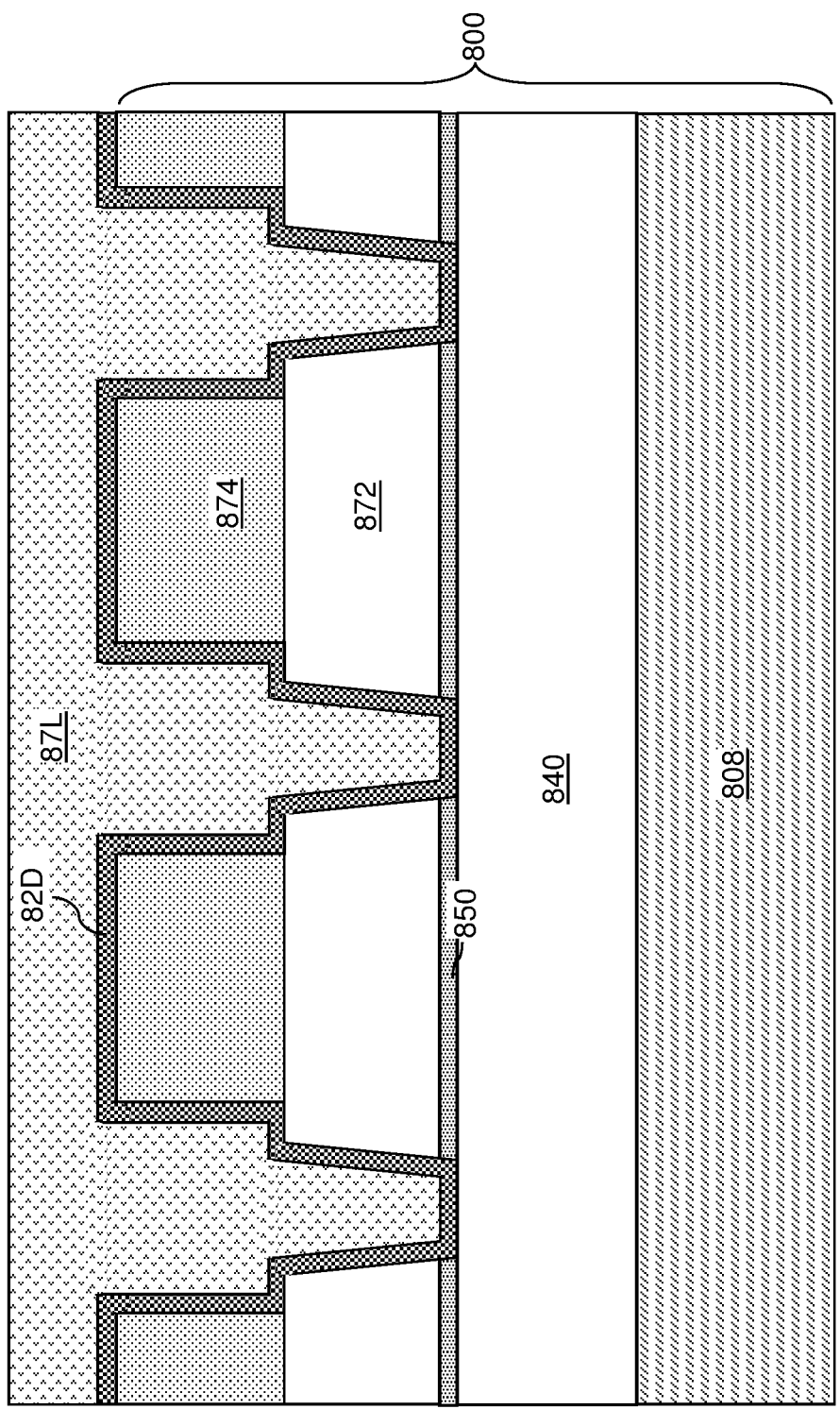
FIG. 16 is a vertical cross-sectional view of the second configuration of the first semiconductor die after formation of a masking material layer according to the second embodiment of the present disclosure.

Referring to FIG. 16, a masking material layer 87L can be formed over the continuous pad-and-via-level metallic liner 82D to fill the entire volume of each first pad cavity 83 and each first via cavity 81. The masking material layer 87L include a material that can be employed as an etch mask material during a subsequent etch process. For example, the masking material layer 87L can include a polymer material such as polyimide, a semiconductor material such as amorphous silicon, or a self-planarizing material, such as flowable oxide (FOX), spin-on glass (SOG) and/or spin-on carbon. The masking material layer 87L can include a self-planarizing material, or may be planarized to provide a horizontal surface.

Figure 17:
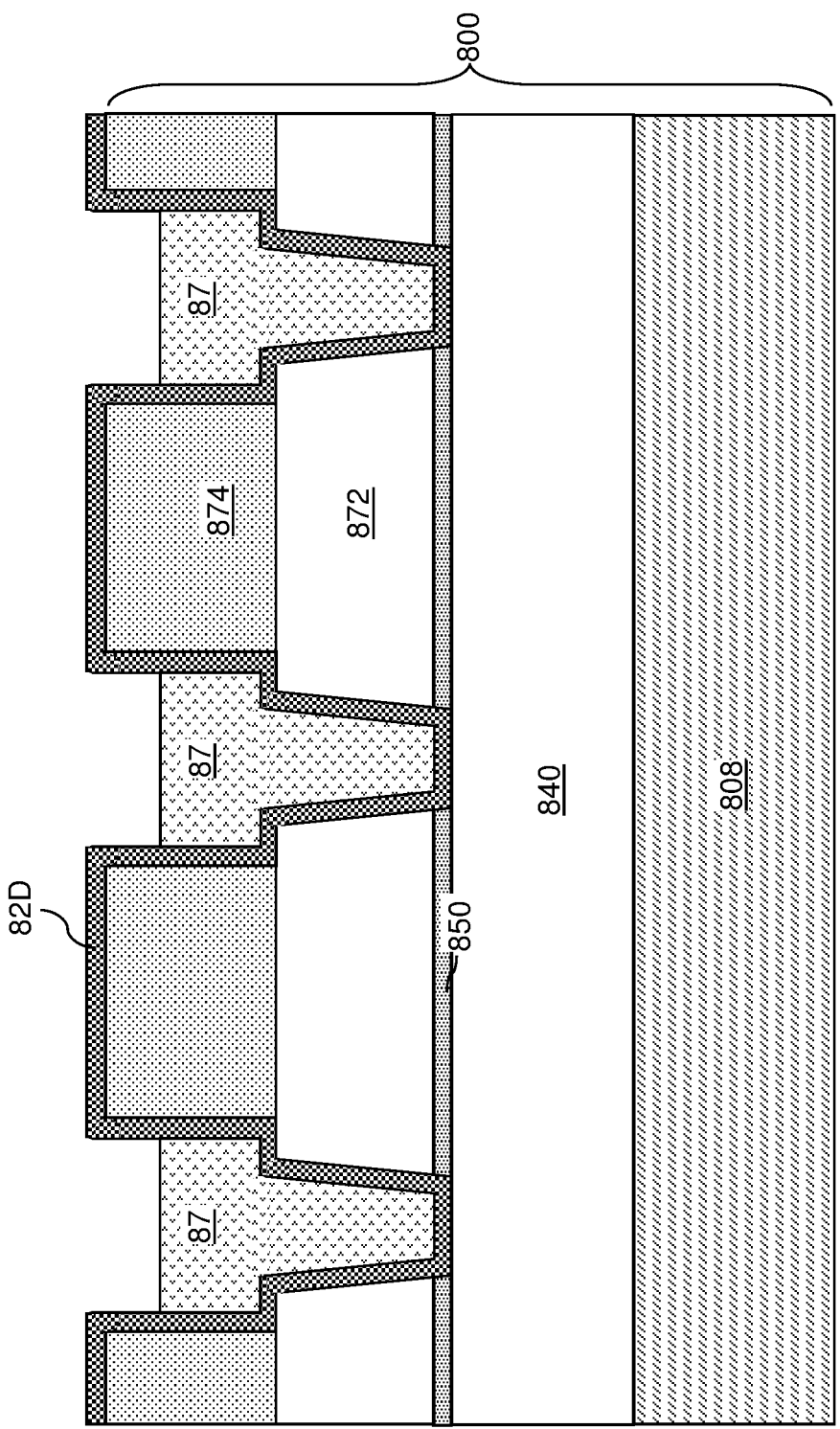
FIG. 17 is a vertical cross-sectional view of the second configuration of the first semiconductor die after formation of masking material portions according to the second embodiment of the present disclosure.

Referring to FIG. 17, the material of the masking material layer 87L can be vertically recessed to remove a horizontally-extending portion of the masking material layer from above the horizontal plane including the topmost surface of the continuous pad-and-via-level metallic liner 82D. The material of the masking material layer 87L can be further recessed such that the top surfaces of remaining portions of the masking material layer 87L are vertically recessed below the horizontal plane including the top surface of the first pad-level dielectric layer 874. Each remaining portion of the material of the masking material layer 87L is herein referred to as a masking material portion 87. A vertical recess distance of the top surfaces of the masking material portions 87 relative to the horizontal plane including the top surface of the first pad-level dielectric layer 874 can be in a range from 10% to 90%, such as from 20% to 80% and/or from 30% to 70%, of a vertical distance between the horizontal plane and a horizontal surface of the continuous pad-and-via-level metallic liner 82D that contacts the first via-level dielectric layer 872.

Figure 18:
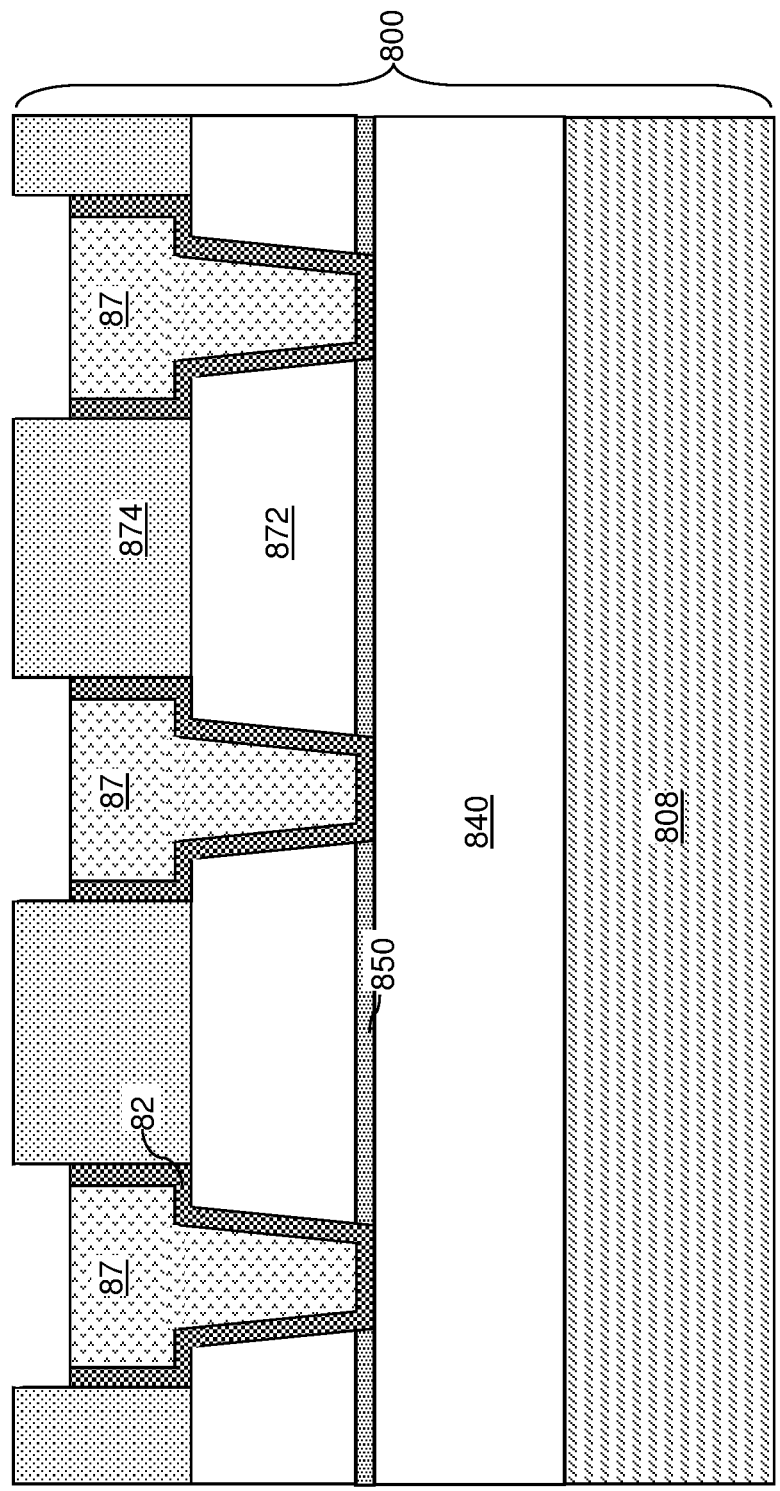
FIG. 18 is a vertical cross-sectional view of the second configuration of the first semiconductor die after formation of metallic liners according to the second embodiment of the present disclosure.

Referring to FIG. 18, an etch process can be performed to etch unmasked portions of the continuous pad-and-via-level metallic liner 82D, i.e., the portions of the continuous pad-and-via-level metallic liner 82D that are not masked by the masking material portions 87. For example, a wet etch process that etches the metallic material of the continuous pad-and-via-level metallic liner 82D selective to the material of the first pad-level dielectric layer 874 can be performed to isotropically etch the unmasked portions of the continuous pad-and-via-level metallic liner 82D. Each remaining patterned portion of the continuous pad-and-via-level metallic liner 82D is herein referred to as a pad-and-via-level metallic liner 82. Each pad-and-via-level metallic liner 82 can have a respective top surface that is vertically recessed below the horizontal plane including the top surface of the first pad-level dielectric layer 874. The vertical recess distance of each pad-and-via-level metallic liner 82 relative to the horizontal plane including the top surface of the first pad-level dielectric layer 874 can be in a range from 10% to 90%, such as from 20% to 80% and/or from 30% to 70%, of the vertical distance between the horizontal plane including the top surface of the first pad-level dielectric layer 874 and the horizontal plane including the horizontal interfaces between the pad-and-via-level metallic liners 82 and the first via-level dielectric layer 872. Each pad-and-via-level metallic liner 82 can have a via-level portion located below the horizontal plane including the interface between the first via-level dielectric layer 872 and the first pad-level dielectric layer 874, and a pad-level portion located above the horizontal plane including the interface between the first via-level dielectric layer 872 and the first pad-level dielectric layer 874.

Figure 19:
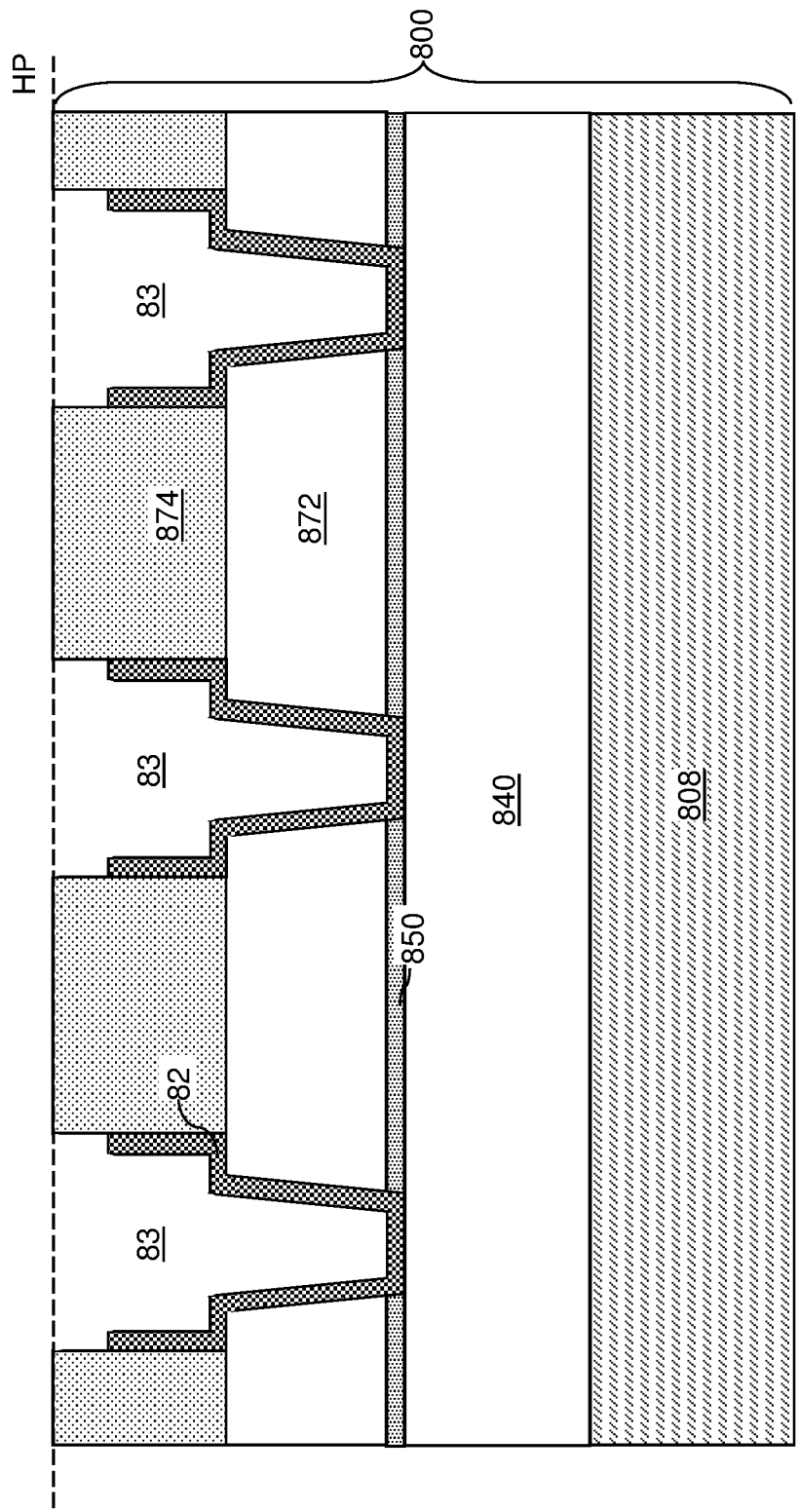
FIG. 19 is a vertical cross-sectional view of the second configuration of the first semiconductor die after removal of the masking material portions according to the second embodiment of the present disclosure.

Referring to FIG. 19, the masking material portions 87 can be removed selective to the materials of the pad-and-via-level metallic liners 82 and the first pad-level dielectric layer 874. For example, masking material portions 87 can be removed by a wet etch process or dissolution in a solvent without etching the materials of the pad-and-via-level metallic liners 82 and the first pad-level dielectric layer 874.

The pad-and-via-level metallic liners 82 are formed in the combined volumes of the first pad cavities 83 and the first via cavities 81. Each of the pad-and-via-level metallic liners 82 is vertically recessed from the horizontal plane HP including the top surface of the first pad-level dielectric layer 874 toward the first substrate 808. Because the top surface of the first pad-level dielectric layer 874 is distal from the first substrate 808, the top surface of the first pad-level dielectric layer 874 is herein referred to as a horizontal distal surface of the first pad-level dielectric layer 874. In one embodiment, the pad-and-via-level metallic liners 82 comprise, and/or consist of, a metallic nitride material.

Figure 20:
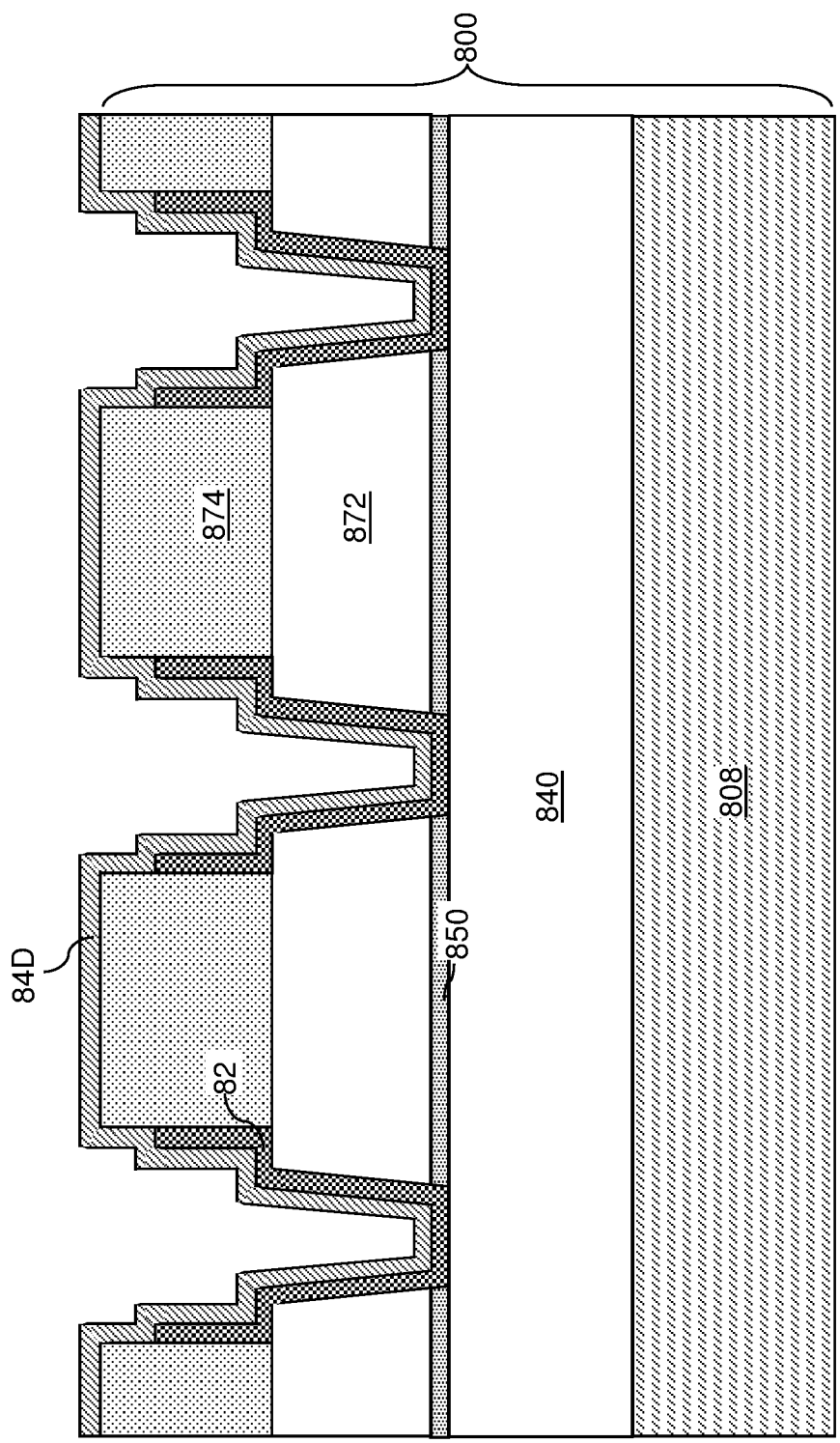
FIG. 20 is a vertical cross-sectional view of the second configuration of the first semiconductor die after formation of a metallic seed layer according to the second embodiment of the present disclosure.

Referring to FIG. 20, an optional continuous pad-and-via-level metallic seed layer 84D can be optionally deposited by a non-conformal deposition process such as a physical vapor deposition process. The continuous pad-and-via-level metallic seed layer 84D includes at least one metallic fill material such as W, Cu, Mo, Ru, Co, Al, another elemental metal, or an intermetallic alloy. The thickness of the continuous pad-and-via-level metallic seed layer 84D on vertical or tapered surfaces can be in a range from 3 nm to 30 nm, although lesser and greater thicknesses can also be employed. The continuous pad-and-via-level metallic seed layer 84D can be formed on physically exposed surfaces of the pad-and-via-level metallic liners 82, on physically exposed portions of the sidewalls of the first pad-level dielectric layer 874, and over the top surface of the first pad-level dielectric layer 874.

Figure 21:
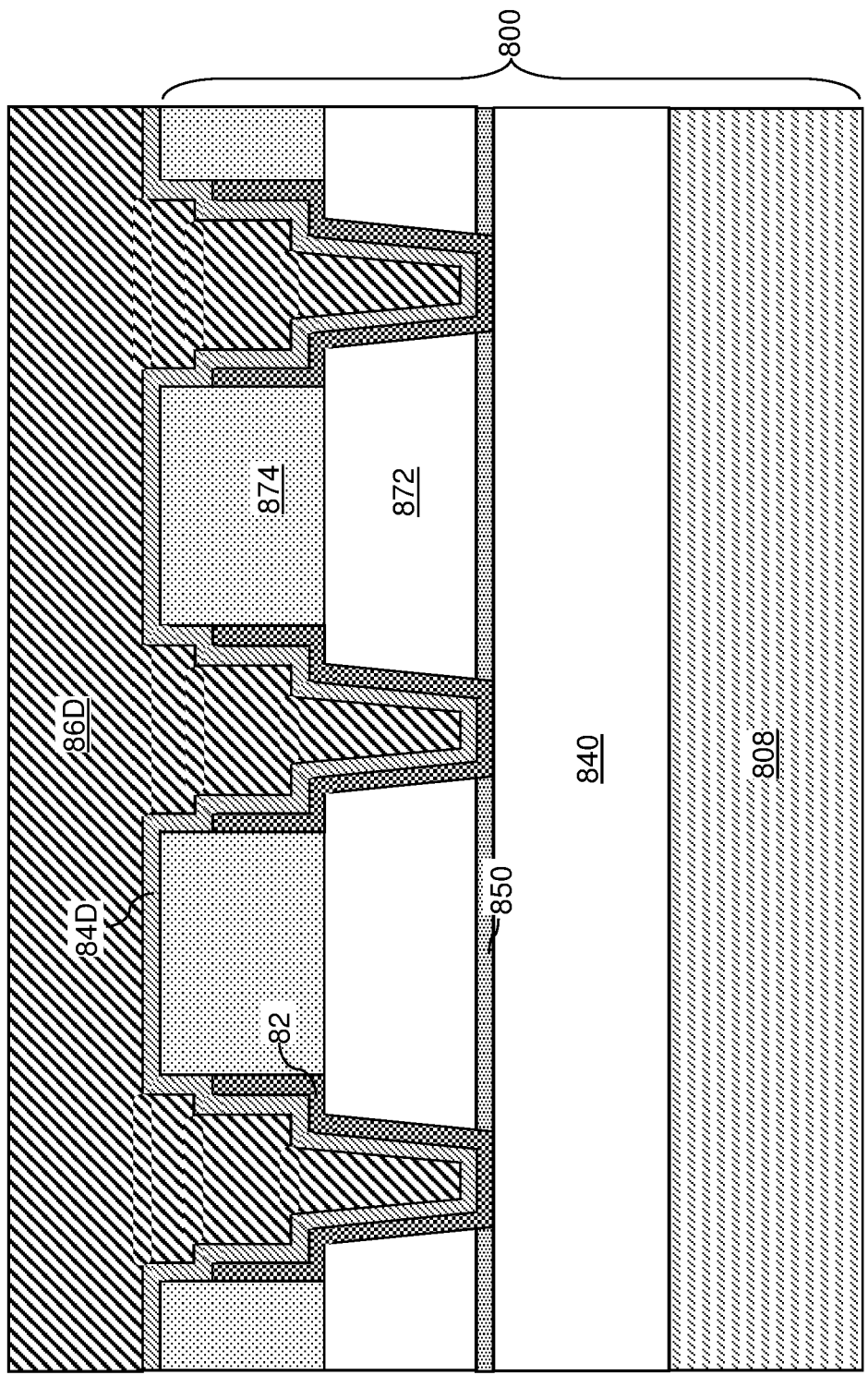
FIG. 21 is a vertical cross-sectional view of the second configuration of the first semiconductor die after formation of a metallic fill layer according to the second embodiment of the present disclosure.

Referring to FIG. 21, a continuous pad-and-via-level metallic fill layer 86D can be deposited by a conformal deposition process (such as a chemical vapor deposition process) or a superconformal deposition process (such as electroplating or electroless plating) to fill remaining volumes of the first pad cavities 83. In one embodiment, the continuous pad-and-via-level metallic fill layer 86D can be formed by electroplating a copper-containing material on the continuous pad-and-via-level metallic seed layer 84D. The continuous pad-and-via-level metallic fill layer can include Cu or a copper alloy. The material of the continuous pad-and-via-level metallic fill layer 86D may be the same as, or different from, the material of the continuous pad-and-via-level metallic seed layer 84D. In one embodiment, the material of the continuous pad-and-via-level metallic fill layer 86D may consist essentially of copper or a copper alloy in which the atomic percentage of copper is at least 50%, and/or at least 70%, and/or at least 90%.

Figure 22:
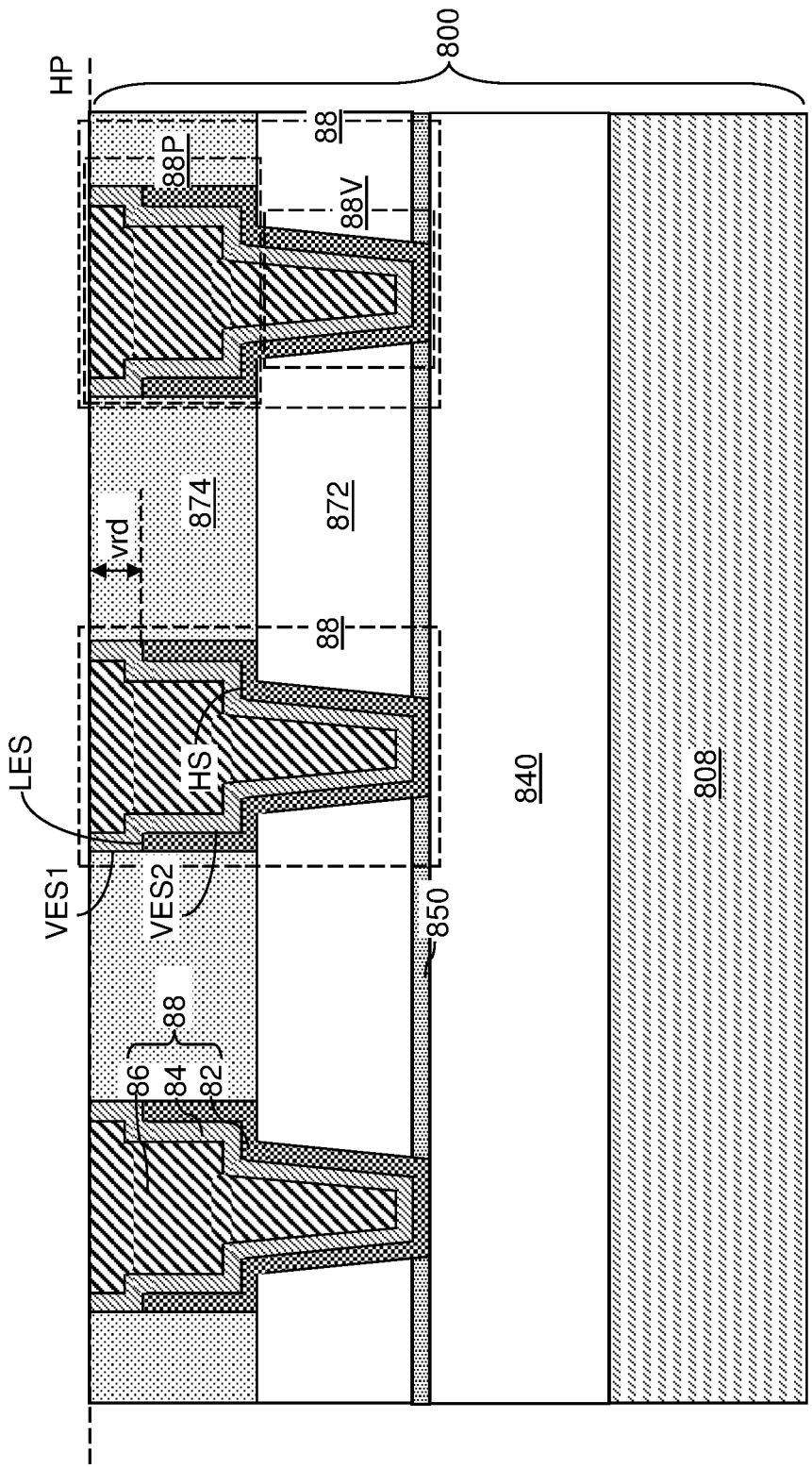
FIG. 22 is a vertical cross-sectional view of the second configuration of the first semiconductor die after formation of first bonding structures according to the second embodiment of the present disclosure.

Referring to FIG. 22, excess portions of the continuous pad-and-via-level metallic fill layer 86D and the continuous pad-and-via-level metallic seed layer 84D can be removed from above the horizontal plane HP including the top surface (i.e., a horizontal distal surface) of the first pad-level dielectric layer 874 by a planarization process. The planarization process can include a chemical mechanical planarization process. Each remaining portion of the at least one conductive material comprises a first bonding structure 88. Each first bonding structure 88 includes a metallic bonding pad and a conductive via structure that are integrated as a single continuous structure. The metallic bonding pad is herein referred to as a first metallic bonding pad 88P, and the conducive via structure is herein referred to as a first conductive via structure 88V. The first bonding structure 88 can include a pad-and-via-level metallic liner 82, an optional pad-and-via-level metallic seed layer 84, and a pad-and-via-level metallic fill portion 86. The pad-and-via-level metallic liner 82 is a remaining patterned portion of the continuous pad-and-via-level metallic liner 82D. The pad-and-via-level metallic seed layer 84 is a remaining patterned portion of the continuous pad-and-via-level metallic seed layer 84D. The pad-and-via-level metallic fill portion 86 is a remaining patterned portion of the continuous pad-and-via-level metallic fill layer 86D.

Each first bonding structure 88 comprises a respective first metallic bonding pad 88P. Each of the first bonding structures 88 comprises a pad-and-via-level metallic fill material portion (84, 86) having a horizontal distal surface that is located within a horizontal plane HP including a horizontal distal surface of the first pad-level dielectric layer 874, and a pad-and-via-level metallic liner 82 laterally surrounding the pad-and-via-level metallic fill material portion (84, 86) and is vertically spaced from the horizontal plane HP by a vertical recess distance vrd. Each contiguous combination of a pad-and-via-level metallic seed layer 84 and a pad-and-via-level metallic fill portion 86 constitutes a pad-and-via-level metallic fill material portion (84, 86). Thus, each first metallic bonding pad 88P includes a combination of a pad-and-via-level metallic liner 82 and a pad-and-via-level metallic fill material portion (84, 86).

The pad-and-via-level metallic fill material portions (84, 86) are formed in remaining volumes of the first pad cavities 83 and the first via cavities 81 that remain after formation of the pad-and-via-level metallic liners 82. The pad-and-via-level metallic fill material portions (84, 86) can be formed directly on upper portions of the sidewalls of the first pad cavities 83. In one embodiment, the pad-and-via-level metallic fill material portions (84, 86) comprise copper. Each pad-and-via-level metallic liner 82 comprises a horizontally-extending portion HS contacting a horizontal surface of a pad-and-via-level metallic fill material portion (84, 86), and a vertically-extending portion adjoined to a periphery of the horizontally-extending portion and contacting a sidewall of the pad-and-via-level metallic fill material portion (84, 86). In one embodiment, the entirety of a sidewall of each pad-level metallic fill material portion (84, 86) may contact the first pad-level dielectric layer 874.

Generally, the first semiconductor die 800 can include a first pad-level dielectric layer 874 overlying the at least one first semiconductor device in the first device structure 840, and first bonding structures comprising a respective first metallic bonding pad 88P embedded in the first pad-level dielectric layer 874 and the first via-level dielectric layer 872. Each of the first bonding structures can comprise a metallic fill material portion (such as a pad-and-via-level metallic fill material portion (84, 86)) having a horizontal distal surface that is located within a horizontal plane HP including a horizontal distal surface of the first pad-level dielectric layer 874, and a metallic liner (such as a pad-and-via-level metallic liner 82) laterally surrounding the metallic fill material portion and is vertically spaced from the horizontal plane HP by a vertical recess distance vrd.

In one embodiment, the metallic liner (such as the pad-and-via-level metallic liner 82) comprises: a horizontally-extending portion HS contacting a horizontal surface of the metallic fill material portion (such as the pad-and-via-level metallic fill material portions (84, 86)), and a vertically-extending portion adjoined to a periphery of the horizontally-extending portion and contacting a sidewall of the metallic fill material portion (such as the pad-and-via-level metallic fill material portion (84, 86)).

In one embodiment, a sidewall of the metallic fill material portion (such as the pad-and-via-level metallic fill material portion (84, 86)) has a stepped profile such that a laterally-extending segment LES of the sidewall connects a first vertically-extending segment VES1 of the sidewall that extends to the horizontal plane HP to a second vertically-extending segment VES2 of the sidewall that extends to the horizontally-extending portion HS of the metallic liner (such as the pad-and-via-level metallic liner 82).

In one embodiment, the laterally-extending segment LES of the metallic fill material portion (such as the pad-and-via-level metallic fill material portion (84, 86)) contacts a distal surface of the metallic liner (such as the pad-and-via-level metallic liner 82) that is most distal from the first substrate 808 among all surfaces of the metallic liner. In one embodiment, the vertical recess distance vrd can be in a range from 10% to 90% of a vertical distance between the horizontal plane HP and a proximal surface of the horizontally-extending portion of the metallic liner (which is located within a horizontal interface between the pad-and-via-level metallic liner 82 and the first via-level dielectric layer 872).

In one embodiment, a first vertically-extending segment VES1 of a stepped sidewall of the metallic fill material portion (such as the pad-and-via-level metallic fill material portion (84, 86)) and an outer sidewall of the metallic liner (such as the pad-and-via-level metallic liner 82) are located within a two-dimensional plane that is vertical or has a taper angle less than 20 degrees relative to a vertical direction, and a second vertically-extending segment VES2 the stepped sidewall of the metallic fill material portion contacts an inner sidewall of the metallic liner, and is parallel to the two-dimensional plane.

In one embodiment, the metallic liners (such as the pad-and-via-level metallic liners 82) comprise a metallic nitride material, and the metallic fill material portions (such as the pad-and-via-level metallic fill material portions (84, 86)) comprise copper. In one embodiment, a sidewall of the metallic fill material portion (such as the pad-and-via-level metallic fill material portion (84, 86)) contacts the first pad-level dielectric layer 874, and a sidewall of the metallic liner (such as the pad-and-via-level metallic liners 82) contacts the first pad-level dielectric layer 874. In one embodiment, the first pad-level dielectric layer 874 comprises silicon carbide nitride. In one embodiment, conductive via structures (such as first conductive via structures 88V) can underlie the first metallic bonding pads 88P, and can contact a horizontal surface of a respective one of the first metallic bonding pads 88P.

The sidewalls of the first metallic bonding pads 88P can contact surfaces of the first pad-level dielectric layer 874, which may include a silicon carbide nitride material. The sidewalls of the first metallic bonding pads 88P can be vertical, or may have a taper angle that is less than 20 degrees relative to the vertical direction. For example, the taper angle may be in a range from 0.1 degree to 5 degrees.

In one embodiment, the first bonding structures 88 can comprise an integrated pad and conductive via structure that includes a first conductive via structure 88V (i.e., a portion of a first bonding structure 88 located under the horizontal plane including the interface between the first via-level dielectric layer 872 and the first pad-level dielectric layer 874) that vertically protrudes from one of the first metallic bonding pads 88P. A metallic liner (such as a pad-and-via-level metallic liner 82) within each of the first bonding structures 88 vertically protrudes into a respective first conductive via structure 88V. A metallic fill material portion (such as a pad-and-via-level metallic fill material portion (84, 86)) within each of the first bonding structures 88 vertically protrudes into a respective first conductive via structure 88V.

Figure 23:
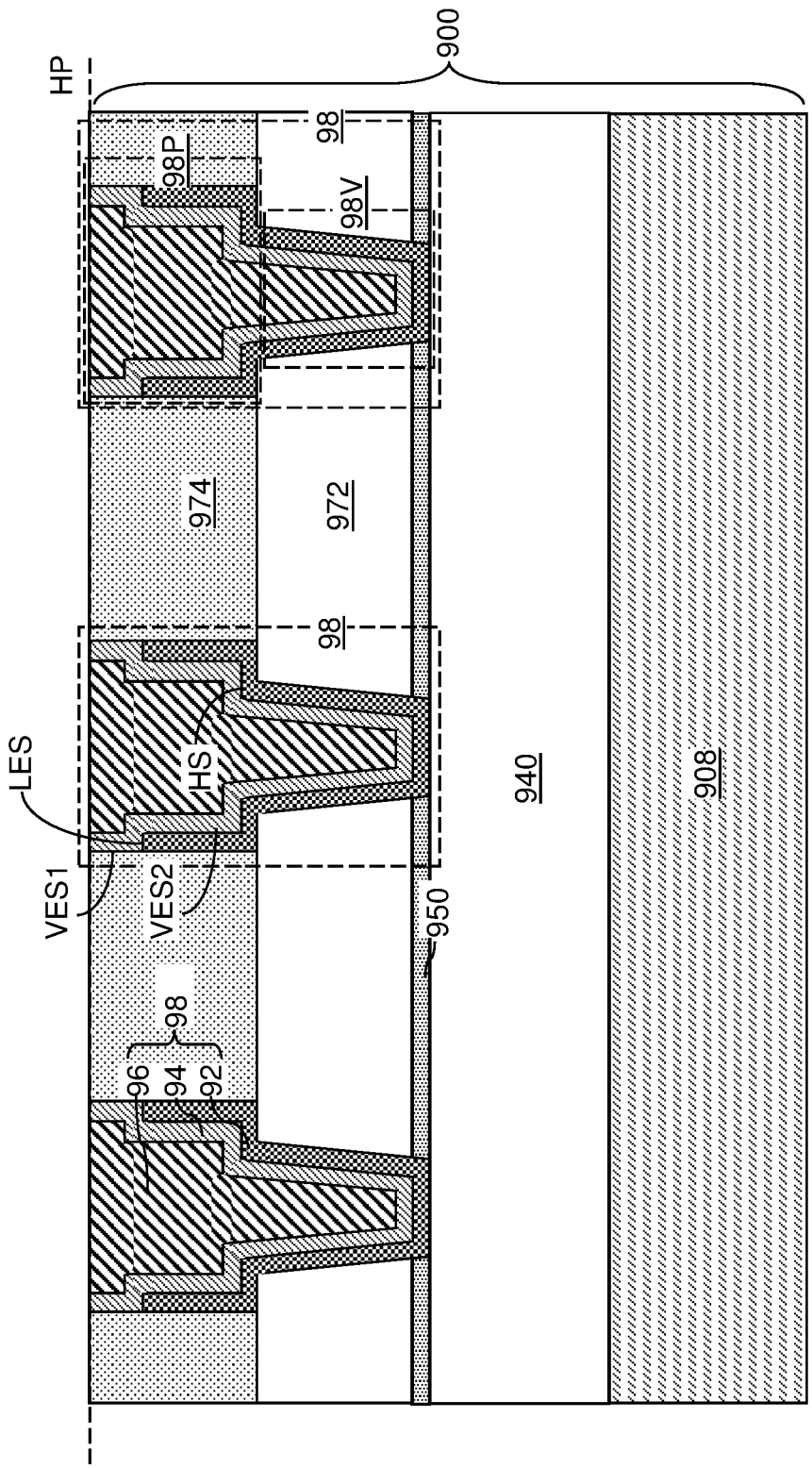
FIG. 23 is a vertical cross-sectional view of a second configuration of a second semiconductor die after formation of second bonding structures according to the first embodiment of the present disclosure.

Referring to FIG. 23, a second configuration of a second semiconductor die 900 according to the second embodiment of the present disclosure is illustrated. The second semiconductor die 900 can include a second substrate 908, a second device structure 940 including at least one second semiconductor device therein, a second etch stop dielectric layer 950, a second via-level dielectric layer 972, a second pad-level dielectric layer 974, and second bonding structures 98 containing metallic bonding pads 98P. Each second metallic bonding pad 98P can include a pad-and-via-level metallic liner 92, an optional pad-and-via-level metallic seed layer 94, and a pad-and-via-level metallic fill portion 96.

The second etch stop dielectric layer 950 can have the same material composition and the same thickness range as the first etch stop dielectric layer 850. The second via-level dielectric layer 972 can have the same material composition and the same thickness range as the first via-level dielectric layer 872. The second pad-and-via-level dielectric layer 974 can have the same material composition and the same thickness range as the first pad-level dielectric layer 874. The pad-and-via-level metallic liners 92 in the second semiconductor die 900 can include any material that can be employed for, and can have a thickness within a same thickness range as, the pad-and-via-level metallic liners 82 in the first semiconductor die 800. The pad-and-via-level metallic seed layers 94 in the second semiconductor die 900 can include any material that can be employed for, and can have a thickness within a same thickness range as, the pad-and-via-level metallic seed layers 84 in the first semiconductor die 800. The pad-and-via-level metallic fill portions 96 in the second semiconductor die 900 can include any material that can be employed for the pad-and-via-level metallic fill portions 86 in the first semiconductor die 800. The portions of the second semiconductor die 900 located above the second semiconductor structure 940 may be formed employing the same manufacturing methods that are employed to form the portions of the first semiconductor die 800 above the first semiconductor structure 840.

In one embodiment, the second bonding structures 98 can comprise an integrated pad and conductive via structure that includes a second conductive via structure 98V (i.e., a portion of a second bonding structure 98 located under the horizontal plane including the interface between the second via-level dielectric layer 972 and the second pad-level dielectric layer 974) that vertically protrudes downward from one of the second metallic bonding pads 98P. A metallic liner (such as a pad-and-via-level metallic liner 92) within each of the second bonding structures 98 vertically protrudes into a respective second conductive via structure 98V. A metallic fill material portion (such as a pad-and-via-level metallic fill material portion (84, 96)) within each of the second bonding structures 98 vertically protrudes into a respective second conductive via structure 98V.

Figure 24:
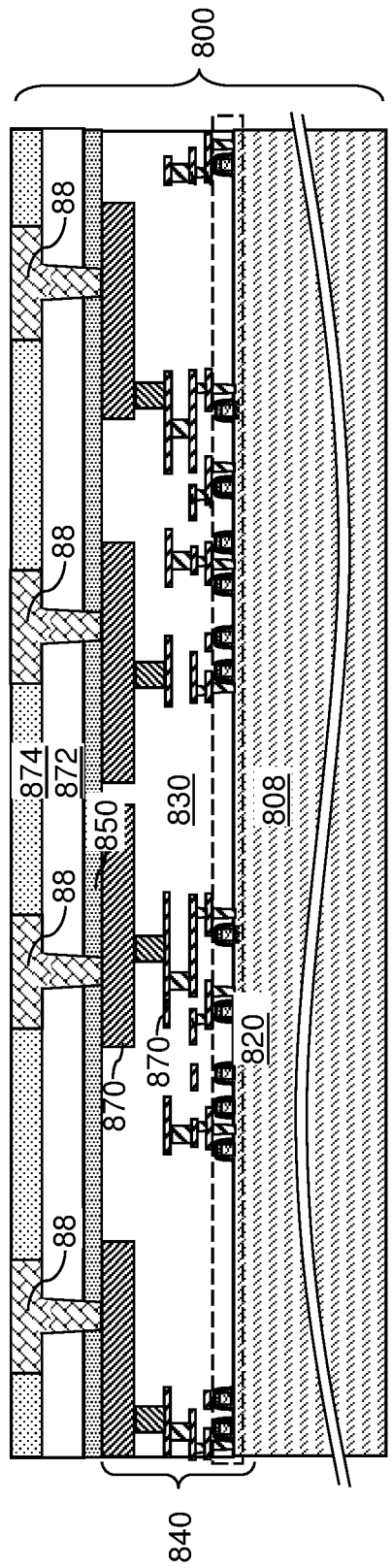
FIG. 24 is a vertical cross-sectional view of a first semiconductor die that comprises a logic die according to an embodiment of the present disclosure.

Referring to FIG. 24, a first semiconductor die 800 is illustrated with exemplary components for the first device structure 840. The first device structure 840 can include first semiconductor devices 820. Generally, the second semiconductor devices 820 may comprise any semiconductor device known in the art. In one embodiment, the second semiconductor devices 820 may include field effect transistors. In one embodiment, the first semiconductor devices 820 can include a control circuit for controlling operation of a three-dimensional memory array that can be provided in the second device structure 940 of the second semiconductor die 900. The first device structure 840 can include first metal interconnect structures 870 embedded in first dielectric material layers 840. The first bonding structures 88 may have the first configuration illustrated in FIG. 11 or the second configuration illustrated in FIG. 22.

Figure 25:
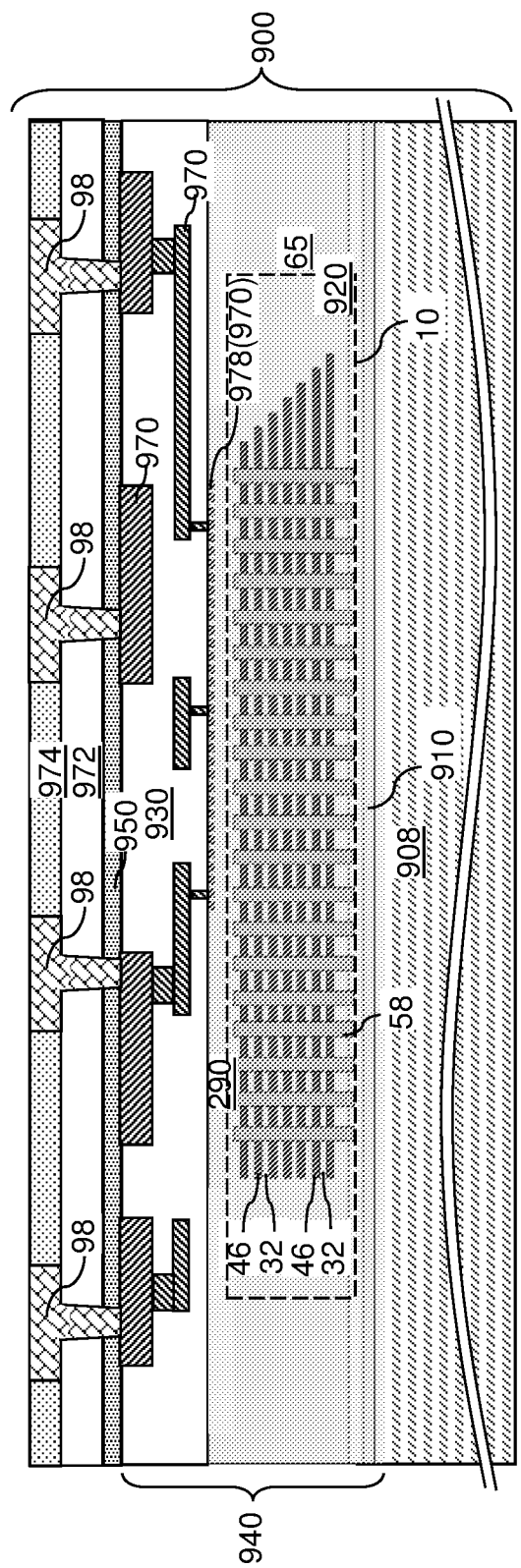
FIG. 25 is a vertical cross-sectional view of a second semiconductor die that comprises memory die according to an embodiment of the present disclosure.

Referring to FIG. 25, a second semiconductor die 900 is illustrated with exemplary components for the second device structure 940. The second semiconductor die 900 can comprise a memory die in which the second device structure 940 includes a three-dimensional array of memory elements, such as a three-dimensional NAND memory device. The second semiconductor die 900 includes a second substrate 908, second semiconductor devices 920 overlying the second substrate 908, second dielectric material layers (290, 930) overlying the second semiconductor devices 920, and second metal interconnect structures 970 embedded in the second dielectric material layers (290, 930). In one embodiment, the second substrate 908 may be a commercially available silicon wafer having a thickness in a range from 500 microns to 1 mm.

Generally, the second semiconductor devices 920 may comprise any semiconductor device known in the art. In one embodiment, the second semiconductor die 900 comprises a memory die, and may include memory devices, such as a three-dimensional NAND memory device. In an illustrative example, the second semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the second substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact conductive via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The second dielectric material layers (290, 930) may include second contact-level dielectric layers 290 embedding contact conductive via structures (not expressly shown) and bit lines 978, and second interconnect-level dielectric layers 930 that embed a subset of the second metal interconnect structures 970 located above the second contact-level dielectric layers 290. The second dielectric material layers (290, 930) laterally extend along horizontal directions that are parallel to the top surface of the second substrate 908.

The bit lines 978 are a subset of the second metal interconnect structures 970 and may electrically contact drain regions located above the semiconductor channel at the top of the memory opening fill structures 58. The contact conductive via structures contact various nodes of the second semiconductor devices. Interconnect metal lines and interconnect metal conductive via structures, which are subsets of the second metal interconnect structures 970, may be embedded in the second interconnect-level dielectric layers 930. The second metal interconnect structures 970 may be located within the second interconnect-level dielectric layers 930. Each of the second contact-level dielectric layers 290 and the second interconnect-level dielectric layers 930 may include a dielectric material such as undoped silicate glass, a doped silicate glass, organosilicate glass, silicon nitride, a dielectric metal oxide, or a combination thereof. The second bonding structures 98 may have the second configuration illustrated in FIG. 12 or the second configuration illustrated in FIG. 23.

Generally, the second semiconductor devices 920 in the second device structure 940 of the second semiconductor die 900 may comprise any semiconductor device that may be operated in conjunction with the first semiconductor devices in the first device structure 840 of the first semiconductor die 800 to provide enhanced functionality. In one embodiment, one of the first semiconductor die 800 and the second semiconductor die 900 can comprise a memory die including a three-dimensional array of memory elements, another of the first semiconductor die 800 and the second semiconductor die 900 comprises a logic die including a logic circuit configured to control operation of memory elements within the three-dimensional array of memory elements. In one embodiment, the first semiconductor die 800 comprises a logic die and the second semiconductor die 900 comprises a memory die. The logic die can include a support circuitry (i.e., driver or peripheral circuitry) for operation of memory devices (such as a three-dimensional array of memory elements, including a three-dimensional NAND memory device) within the memory die.

Figure 26:
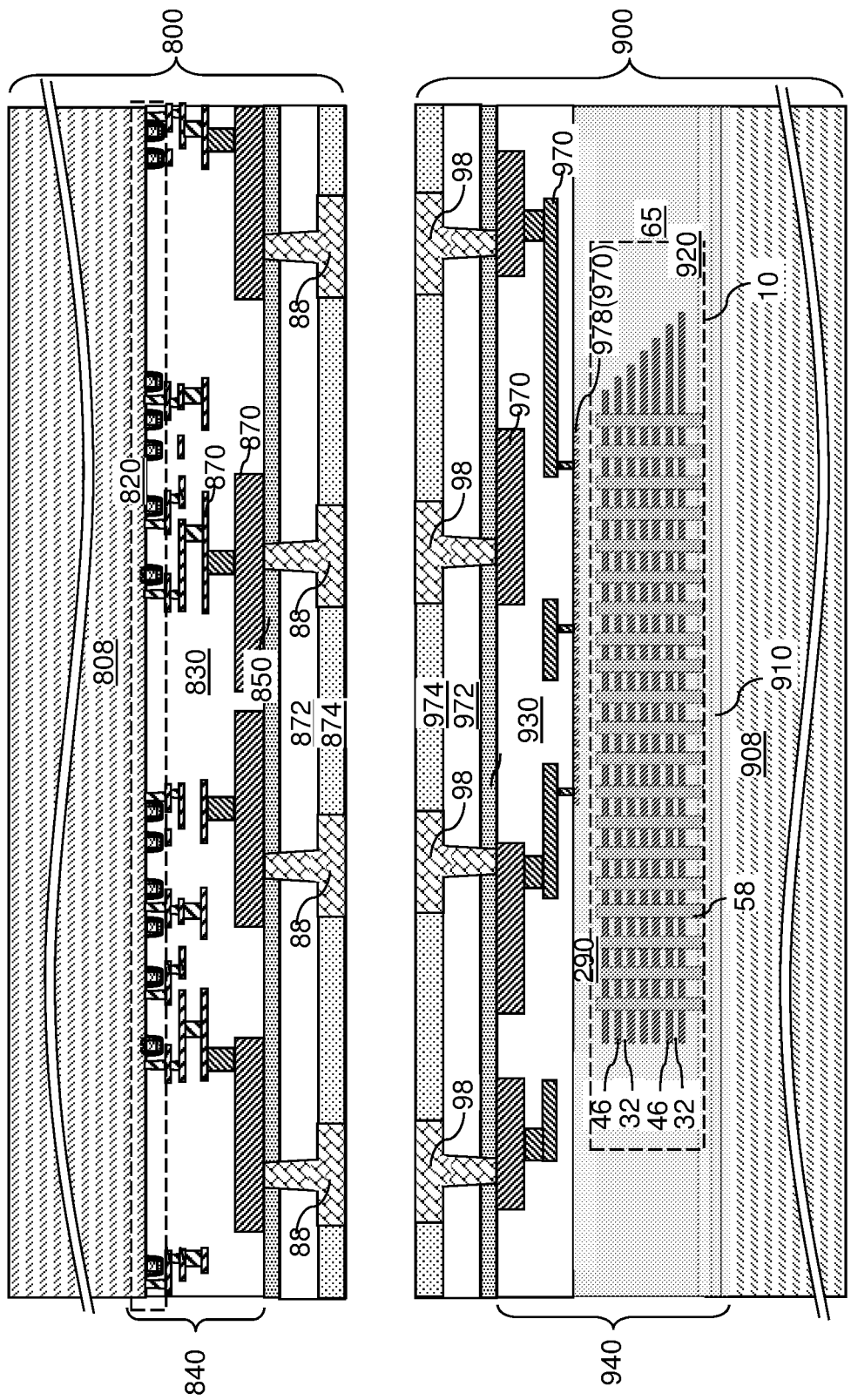
FIG. 26 is a schematic vertical cross-sectional view of an exemplary structure after aligning the second semiconductor die to the first semiconductor die according to an embodiment of the present disclosure.

Referring to FIG. 26, the first semiconductor die 800 and the second semiconductor die 900 are oriented such that the first pad-level dielectric layer 874 faces the pad-level dielectric layer 974. Each of the first bonding structures 88 containing the first metallic bonding pads 88P can face a respective one of the second bonding structures 98 containing second metallic bonding pads 98P and vice versa upon alignment of the first semiconductor die 800 to the second semiconductor die 900.

Figure 27:
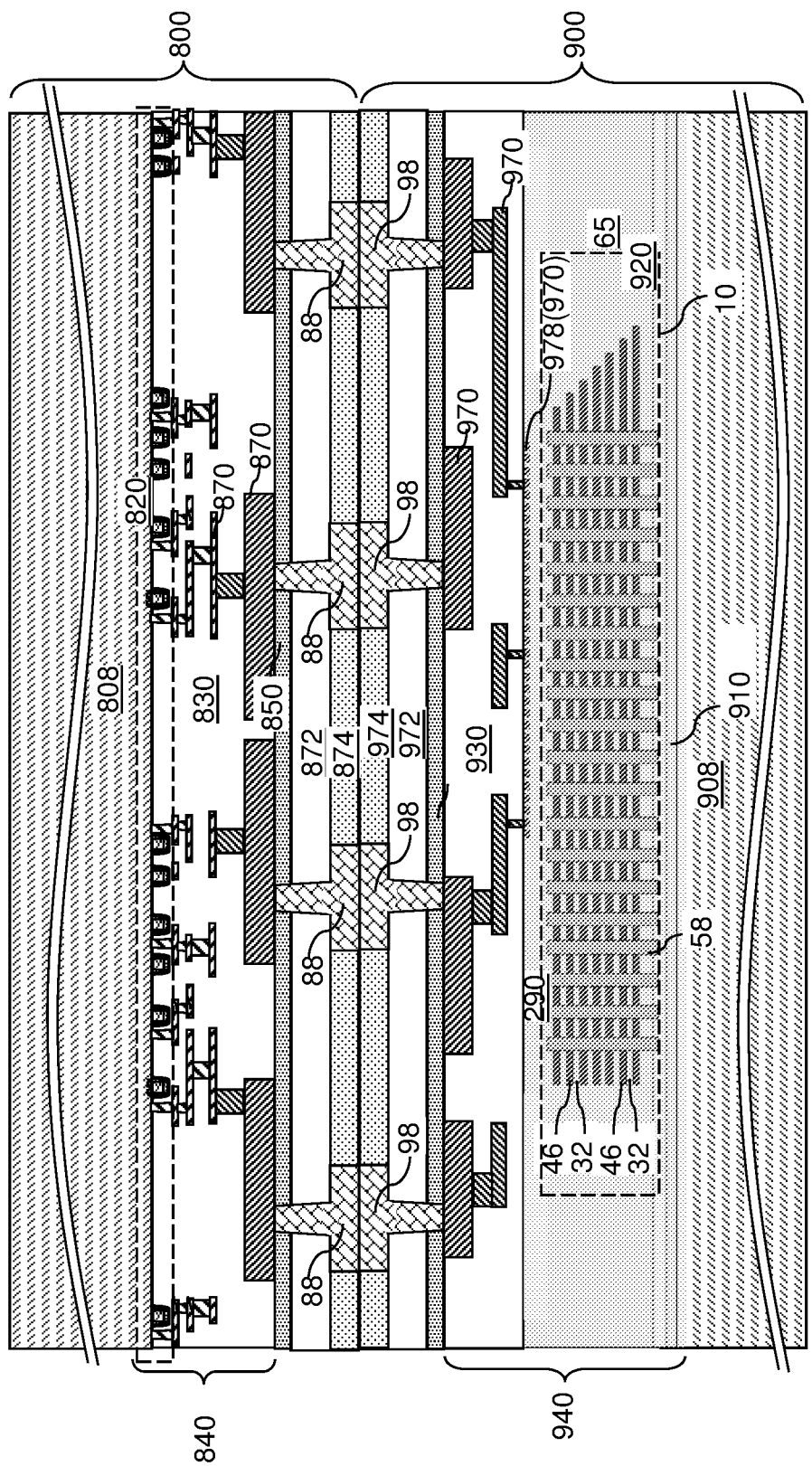
FIG. 27 is a schematic vertical cross-sectional view of the exemplary structure after bonding the second semiconductor die to the first semiconductor die according to an embodiment of the present disclosure.
Figure 28:
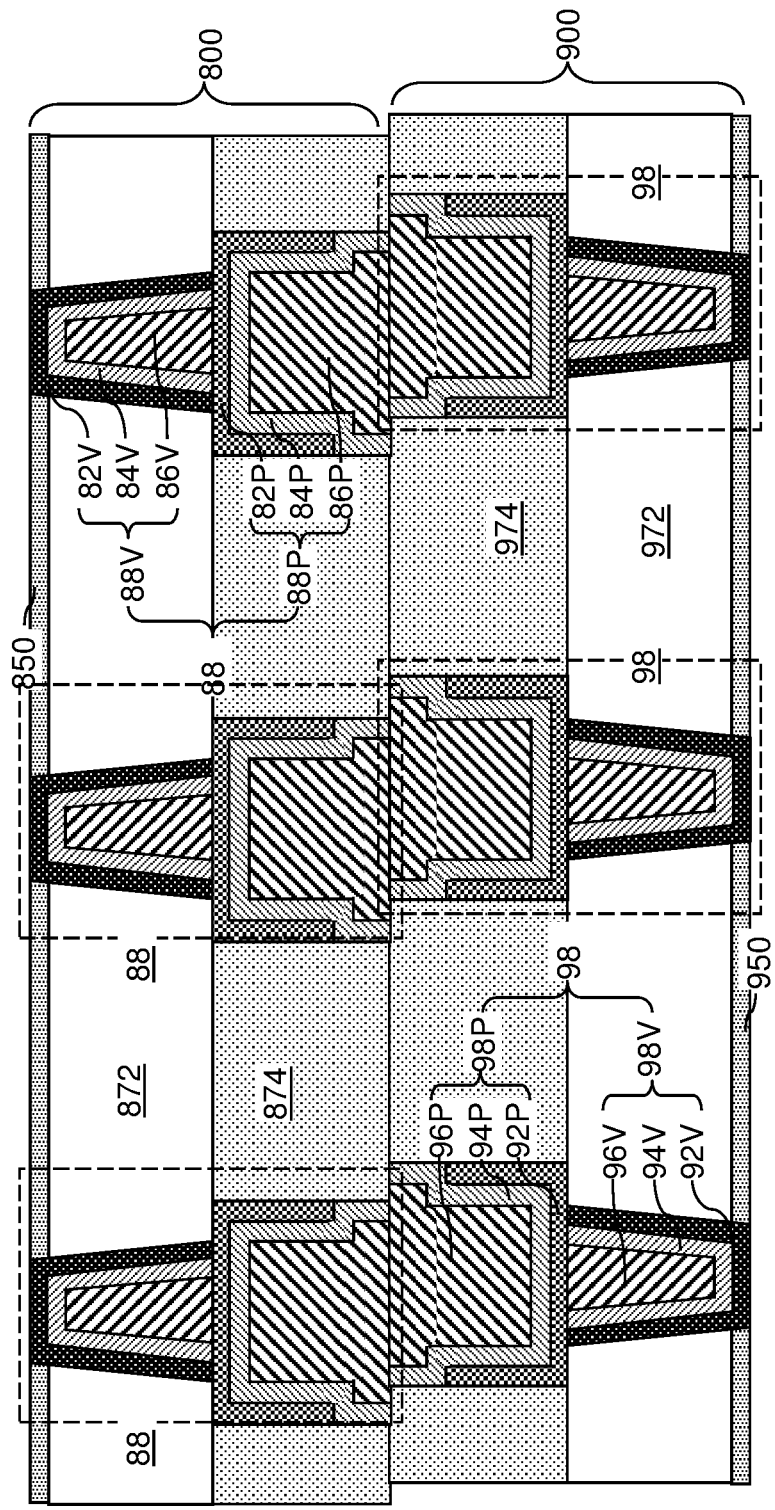
FIG. 28 is a magnified view of a first configuration of the exemplary structure at the processing steps of FIG. 27.
Figure 29:
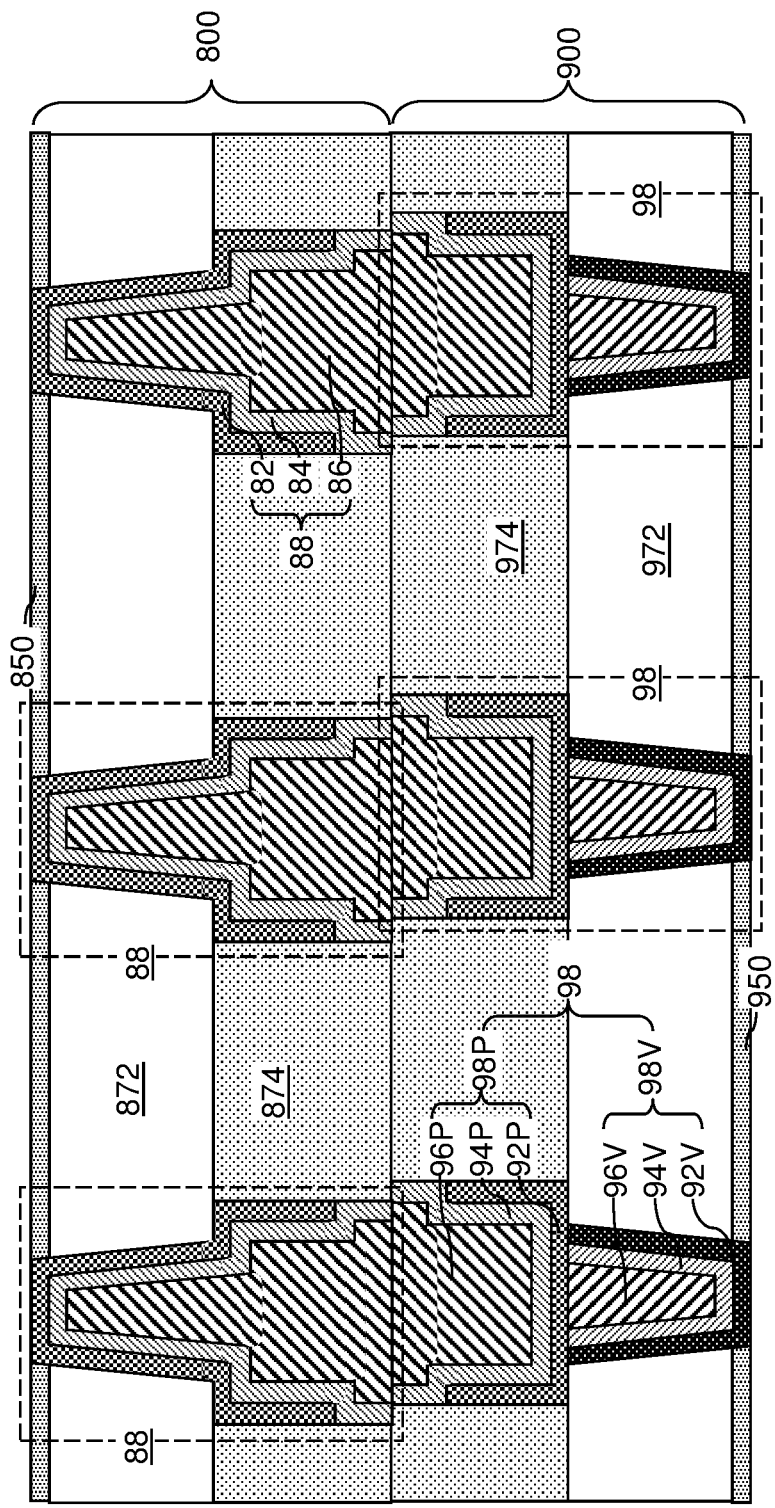
FIG. 29 is a magnified view of a first configuration of the exemplary structure at the processing steps of FIG. 27.

Referring to FIGS. 27-31, the first semiconductor die 800 and the second semiconductor die 900 are brought into contact with each other such that the first pad-level layer 874 contacts the second pad-level dielectric layer 974. Each first metallic bonding pad 88P can contact a respective one of the second metallic bonding pad 98P at a respective horizontal interface located within a horizontal plane including the interfaces between the first pad-level layer 874 and the second pad-level dielectric layer 974. FIG. 27 is a vertical cross-sectional view of a bonded assembly of the first semiconductor die 800 and the second semiconductor die 900. FIG. 28 is a magnified vertical cross-sectional view of a bonding region of the bonded assembly for the case in which the first semiconductor die 800 has the first configuration illustrated in FIG. 11, and the second semiconductor die 900 has the first configuration illustrated in FIG. 12. FIG.

Figure 30:
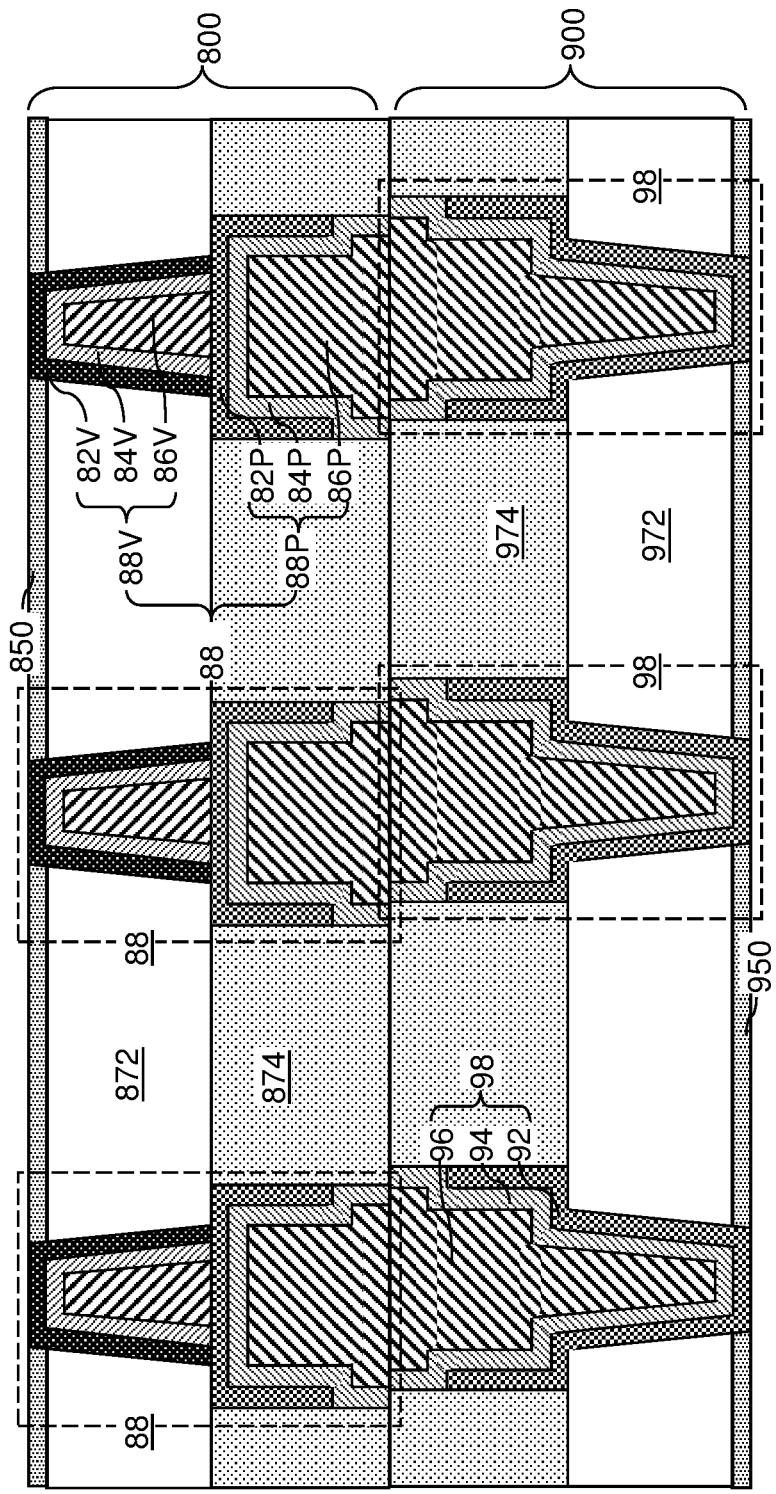
FIG. 30 is a magnified view of a first configuration of the exemplary structure at the processing steps of FIG. 27.
Figure 31:
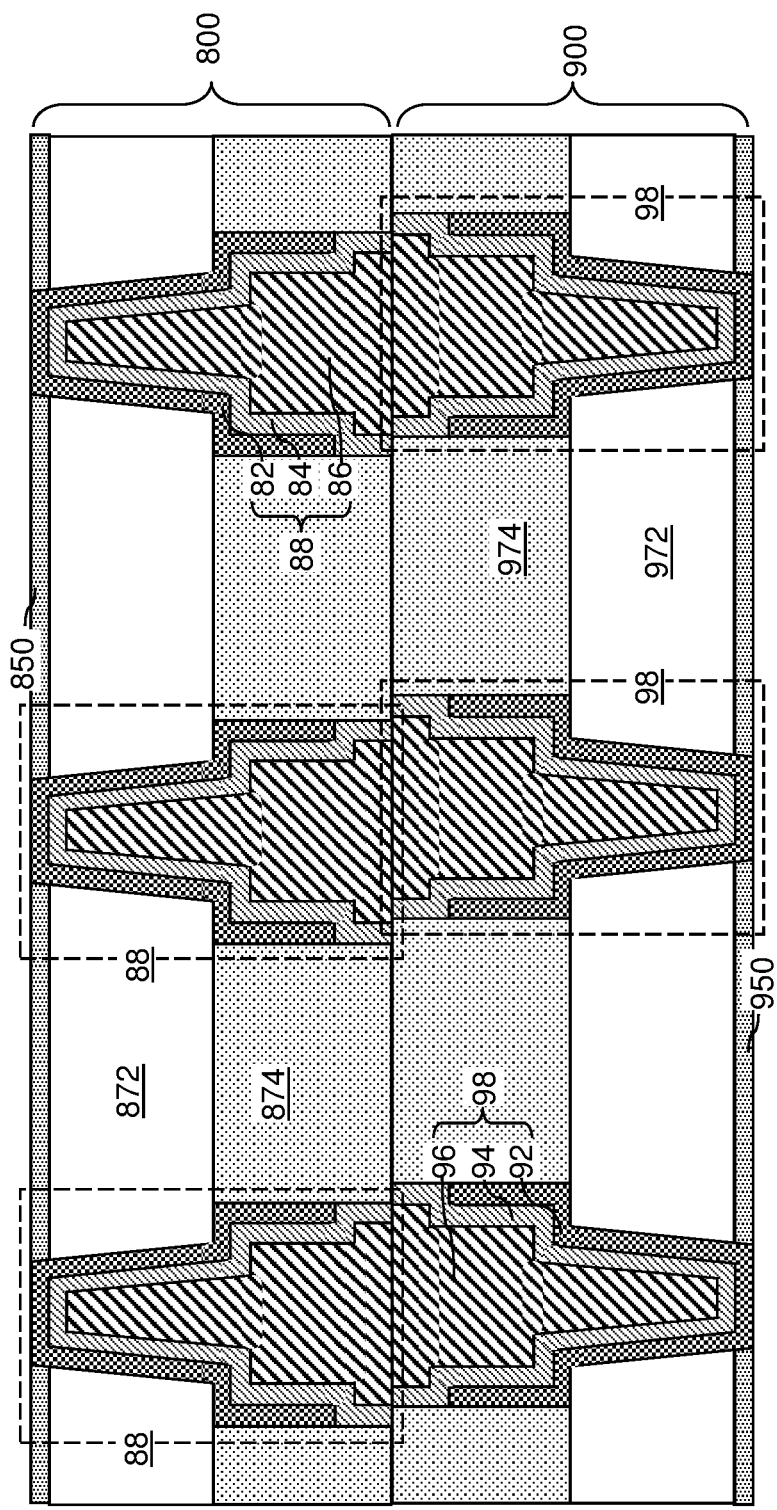
FIG. 31 is a magnified view of a first configuration of the exemplary structure at the processing steps of FIG. 27.

29 is a magnified vertical cross-sectional view of a bonding region of the bonded assembly for the case in which the first semiconductor die 800 has the second configuration illustrated in FIG. 22, and the second semiconductor die 900 has the first configuration illustrated in FIG. 12. FIG. 30 is a magnified vertical cross-sectional view of a bonding region of the bonded assembly for the case in which the first semiconductor die 800 has the first configuration illustrated in FIG. 11, and the second semiconductor die 900 has the second configuration illustrated in FIG. 23. FIG. 31 is a magnified vertical cross-sectional view of a bonding region of the bonded assembly for the case in which the first semiconductor die 800 has the second configuration illustrated in FIG. 22, and the second semiconductor die 900 has the second configuration illustrated in FIG. 23.

An anneal process at an elevated temperature to induce metal-to-metal bonding between each mating pair of a first metallic bonding pad 88P and a second metallic bonding pad 98P. If the pad-level metallic fill material portions (84P, 86P) of the first metallic bonding pads 88P and the pad-level metallic fill material portions (94P, 96P) of the second metallic bonding pads 98P include copper, the elevated temperature may be in a range from 200 degrees Celsius to 400 degrees Celsius. Metal-to-metal bonding is formed between each mating pair of a first metallic bonding pad 88P and a second metallic bonding pad 98P at a respective horizontal bonding interface. Thus, each of the second metallic bonding pads 98P can be bonded to a respective one of the first metallic bonding pads 88P.

Generally, the first bonding structures 88 comprise a respective first metallic bonding pad 88P embedded in the first pad-level dielectric layer 874 and bonded to a respective one of the second metallic bonding pads 98P. The second bonding structures 98 comprise a respective second metallic bonding pad 98P embedded in the second pad-level dielectric layer 974 and bonded to a respective one of the first metallic bonding pads 88P. Each of the first bonding structures 88 comprises a metallic fill material portion (such as a pad-level metallic fill material portion (84P, 86P) or a pad-and-via-level metallic fill material portion (84, 86)), and a respective metallic liner (such as a pad-level metallic liner 82P or a pad-and-via-level metallic liner 82) laterally surrounding the respective metallic fill material portion and is vertically spaced from the horizontal plane including the bonding interfaces by a vertical recess distance. Each of the second bonding structures 98 comprises a respective additional metallic fill material portion (such as a pad-level metallic fill material portion (94P, 96P) or a pad-and-via-level metallic fill material portion (94, 96)) that is bonded to a respective one of the metallic material portions (such as a pad-level metallic fill material portion (84P, 86P) or a pad-and-via-level metallic fill material portion (84, 86)) at the horizontal plane including the bonding interfaces, and a respective additional metallic liner (such as a pad-level metallic liner 92P or a pad-and-via-level metallic liner 92) laterally surrounding the respective additional metallic fill material portion and is vertically spaced from the horizontal plane including the bonding interfaces by another vertical recess distance.

The various embodiments of the present disclosure can be employed to form a bonded assembly including a self-aligned diffusion barrier structure comprising the pad-level dielectric layers (874, 974). Specifically, the entire periphery of each metallic fill material portion {(84P, 86P), (84, 86), (94P, 96P), (94, 96)} can be laterally contacted by a combination of a respective pad-level dielectric layer (874, 974) and a respective metallic liner (82P, 82, 92P, 92) without any gap. The pad-level dielectric layer (874, 974) can include a dielectric diffusion barrier material such as a silicon nitride carbide material, and can function as a dielectric diffusion barrier structure. The metallic liners (82P, 82, 92P, 92) function as a metallic diffusion barrier material for the metallic fill material portions {(84P, 86P), (84, 86), (94P, 96P), (94, 96)}. By vertically recessing the metallic liners (82P, 82, 92P, 92) relative to the top surface of a pad-level dielectric layer (874, 974), undesirable recesses at peripheral portions of the metallic fill material portions {(84P, 86P), (84, 86), (94P, 96P), (94, 96)} can be avoided during the planarization process that removes excess portions of the metallic fill materials from above the horizontal plane including the top surface of the pad-level dielectric layer (874, 974).

Furthermore, since the first pad-level dielectric layer 874 and the second pad-level dielectric layer 974 can include a dielectric diffusion barrier material such a silicon carbide nitride, the diffusion of the metallic material of the metallic fill material portions {(84P, 86P), (84, 86), (94P, 96P), (94, 96)}, such as copper, through the first pad-level dielectric layer 874 and/or the second pad-level dielectric layer 974 can be prevented or suppressed. If the respective bonding pads of the first and second dies are partially misaligned, as shown in FIG. 28, then the dielectric diffusion barrier material of the one die reduces or prevents diffusion of the copper from the portion of the bonding pad of the opposing die that contacts this dielectric diffusion barrier material. Thus, formation of voids in the bonding structures (88, 98) may be eliminated or reduced.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A structure comprising a first semiconductor die, wherein the first semiconductor die comprises:
   at least one first semiconductor device located on a first substrate;
   a first pad-level dielectric layer comprising a diffusion barrier overlying the at least one first semiconductor device; and
   first bonding structures comprising a respective first metallic bonding pad embedded in the first pad-level dielectric layer,
wherein each of the first bonding structures comprises:
   a metallic fill material portion having a horizontal distal surface that is located within a horizontal plane including a horizontal distal surface of the first pad-level dielectric layer; and a metallic liner laterally surrounding the metallic fill material portion and vertically spaced from the horizontal plane by a vertical recess distance.

2. The structure of claim 1, wherein the metallic liner comprises:
a horizontally-extending portion contacting a horizontal surface of the metallic fill material portion; and
a vertically-extending portion adjoined to a periphery of the horizontally-extending portion and contacting a sidewall of the metallic fill material portion.

3. The structure of claim 2, wherein a sidewall of the metallic fill material portion has a stepped profile such that a laterally-extending segment of the sidewall connects a first vertically-extending segment of the sidewall extending to the horizontal plane to a second vertically-extending segment of the sidewall extending to the horizontally-extending portion of the metallic liner.

4. The structure of claim 3, wherein the laterally-extending segment of the metallic fill material portion contacts a distal surface of the metallic liner that is most distal from the first substrate of all surfaces of the metallic liner.

5. The structure of claim 2, wherein the vertical recess distance is in a range from 10% to 90% of a vertical distance between the horizontal plane and a proximal surface of the horizontally-extending portion of the metallic liner.

6. The structure of claim 1, wherein:
a first vertically-extending segment of a stepped sidewall of the metallic fill material portion and an outer sidewall of the metallic liner are located within a two-dimensional plane that is vertical or has a taper angle less than 20 degrees relative to a vertical direction; and
a second vertically-extending segment of the stepped sidewall of the metallic fill material portion contacts an inner sidewall of the metallic liner and is parallel to the two-dimensional plane.

7. The structure of claim 1, wherein:
the metallic liners comprise a metallic nitride material; and
the metallic fill material portions comprise copper.

8. The structure of claim 1, wherein:
a sidewall of the metallic fill material portion contacts the first pad-level dielectric layer; and
a sidewall of the metallic liner contacts the first pad-level dielectric layer.

9. The structure of claim 1, wherein the first pad-level dielectric layer comprises silicon carbide nitride.

10. The structure of claim 1, wherein:
one of the first bonding structures comprises an integrated pad and conductive via structure that includes a first conductive via structure that vertically protrudes from one of the first metallic bonding pads;
a metallic liner within the one of the first bonding structures vertically protrudes into the first conductive via structure; and
a metallic fill material portion within the one of the first bonding structures vertically protrudes into the first conductive via structure.

11. The structure of claim 1, further comprising conductive via structures that underlie the first bonding metallic bonding pads and contacting a horizontal surface of a respective one of the first metallic bonding pads.

12. The structure of claim 1, further comprising a second semiconductor die, wherein the second semiconductor die comprises:
at least one second semiconductor device located on a second substrate;
a second pad-level dielectric layer comprising a diffusion barrier underlying the at least one second semiconductor device; and
second bonding structures comprising a respective second metallic bonding pad embedded in the second pad-level dielectric layer and bonded to a respective one of the first metallic bonding pads.

13. The structure of claim 12, wherein each of the second bonding structures comprises:
a respective additional metallic fill material portion that is bonded to a respective one of the metallic material portions at the horizontal plane; and
a respective additional metallic liner laterally surrounding the respective additional metallic fill material portion and is vertically spaced from the horizontal plane by another vertical recess distance.

14. The structure of claim 12, wherein:
one of the first semiconductor die and the second semiconductor die comprises a memory die including a three-dimensional array of memory elements; and
another of the first semiconductor die and the second semiconductor die comprises a logic die including a logic circuit configured to control operation of memory elements within the three-dimensional array of memory elements.

* * * * *